(12) United States Patent  (10) Patent No.: US 8,576,951 B2
Mombers et al.  (45) Date of Patent: Nov. 5, 2013

(54) MIXED-SIGNAL RADIO FREQUENCY RECEIVER IMPLEMENTING MULTI-MODE SPUR AVOIDANCE

(75) Inventors: Friederich Mombers, Sunnyvale, CA (US); Alain-Serge Porret, Sunnyvale, CA (US); Melly Thierry, Lausanne (CH)

(73) Assignee: SiGear Europe Sarl, Lausanne (CH)

( * ) Notice: Subject to any disclaimer, the term of this patent is extended or adjusted under 35 U.S.C. 154(b) by 197 days.

(21) Appl. No.: 13/280,301

(22) Filed: Oct. 24, 2011

(65) Prior Publication Data

US 2013/0101068 A1  Apr. 25, 2013

(51) Int. Cl.
  *H03K 9/00* (2006.01)
(52) U.S. Cl.
  USPC ............ 375/316; 375/340; 375/260; 341/118
(58) Field of Classification Search
  USPC ............................ 375/316, 340, 260; 341/118
  See application file for complete search history.

(56) References Cited

U.S. PATENT DOCUMENTS

| | | | |
|---|---|---|---|
| 5,640,547 A * | 6/1997 | Hotta et al. .................... | 713/500 |
| 6,356,129 B1 | 3/2002 | O'Brien et al. | |
| 6,785,527 B2 | 8/2004 | Earls | |
| 7,202,656 B1 | 4/2007 | Gearhardt et al. | |
| 2004/0113675 A1 | 6/2004 | Joo | |
| 2004/0156572 A1 | 8/2004 | Richardson et al. | |
| 2006/0288248 A1 | 12/2006 | Yamaguchi | |
| 2007/0176819 A1 * | 8/2007 | May .............................. | 341/155 |
| 2008/0025457 A1 | 1/2008 | Pyeon | |
| 2008/0181337 A1 * | 7/2008 | Maxim ......................... | 375/340 |
| 2010/0103004 A1 * | 4/2010 | Dunne et al. .................. | 341/118 |
| 2010/0328127 A1 * | 12/2010 | Sampath et al. ............... | 341/144 |
| 2011/0244812 A1 | 10/2011 | Cowley et al. | |

OTHER PUBLICATIONS

Djordje Babic et al., "Reconstruction of Non-Uniformly Sampled Signal Using Transposed Farrow Structure," Institute of Communications Engineering, Tampere University of Technology Paper, ©2004 IEEE, pp. 221-224.

Vesa Lehtinen et al, "Structures for Interpolation, Decimation, and Nonuniform Sampling Based on Newton's Interpolation Formula," Department of Communications Engineering Paper, Tampere University of Technology Paper, 4 pages.

* cited by examiner

*Primary Examiner* — Eva Puente
(74) *Attorney, Agent, or Firm* — Van Pelt, Yi & James LLP

(57) ABSTRACT

A mixed-signal radio frequency receiver implements multiple spur avoidance modes to reduce or remove spurs or digital noise injection into the received channel to enhance the receiver performance. The multiple spur avoidance modes are reconfigurable to allow a single mode or multiple modes to be selected for use depending on the application. One or more spur avoidance modes can be selected to enhance the performance of the receiver or the modes can be selected to reduce power consumption. The same spur avoidance circuit is used to support all of the spur avoidance modes by reconfiguring the circuit for each mode or each combination of modes. In another embodiment, a clock masking scheme is applied to align analog and digital clock edges to separate digital activities from sensitive analog activities.

19 Claims, 8 Drawing Sheets

MIXED-SIGNAL RADIO FREQUENCY RECEIVER IMPLEMENTING MULTI-MODE SPUR AVOIDANCE

FIELD OF THE INVENTION

The present invention relates to a radio frequency receiver, and in particular, the present invention relates to a mixed-signal radio frequency receiver implementing multiple spur avoidance modes.

DESCRIPTION OF THE RELATED ART

A television (TV) or video recorder includes a television signal receiver (or television receiver) to receive terrestrial broadcast, cable television or satellite broadcast television signals and to process the television signals into the appropriate video and audio signals for display or for recording. Television signals are transmitted in analog or digital formats and in accordance with a variety of standards. For analog television transmission, the NTSC (National Television Standards Committee) standard, the PAL (Phase Alternate Lines) standard, and the SECAM (Sequential Couleur Avec Memoire) standard are widely adopted. On the other hand, for digital television (DTV) transmission, the DVB (Digital Video Broadcast) format, the ATSC (Advanced Television Standards Committee) format and other digital television broadcasting formats are available. The different television formats and different television standards are incompatible and television receivers for receiving both analog and digital formats and for receiving multiple television standards have been developed.

Complex Radio-Frequency (RF) receivers generally benefit from having one part of the processing being executed in the analog domain and the other part being carried in the digital domain after adequate analog-to-digital conversion of the signals. Often the digital and analog circuitries share the same silicon die or can be separated dies assembled inside the same package or separate packages assembled on a common printed circuit board.

Integrating digital processing brings many advantages in terms of processing quality, reconfigurability and programmability as well as system integration. However, digital transistors switching generates a lot of impulse noise when AC current is drawn from the power supplies to charge or discharge internal node capacitances. This noise will typically be coupled to the sensitive radio input through coupling in the substrate, the package or on the PCB board. The noise coupling will generally result in an array of discrete spurs (Dirac delta in the frequency domain) that degrade the quality of the signal at the input of the receiver. These spurs will be generated at the clock frequency and its multiples but can also be generated at sub harmonics by some cyclic activity components of the digital circuits.

Wideband receivers such as TV tuners that cover a 40 MHz to 1 GHz frequency band are very sensitive to these spurs that, when they fall in-band of the tuned signal, will degrade the input signal-to-noise ratio and can create unwanted visual patterns, especially in the case of analog TV transmission.

SUMMARY OF THE INVENTION

According to one embodiment of the present invention, a spur avoidance circuit in a mixed-signal radio frequency (RF) receiver where the receive is coupled to receive an incoming RF signal and to generate at least a processed digital output signal and, the RF receiver includes at least an RF-Analog front end circuit, an analog-to-digital converter (ADC) and a digital signal processor (DSP), includes a clock synthesizer circuit, a clock generator circuit, an input buffer, an input sample rate converter, an output sample rate converter, an output buffer and a set of bypass signal paths.

The clock synthesizer circuit is configured to generate a first clock signal having a first clock frequency. The clock generator circuit is configured to receive the first clock signal and to generate a second clock signal to control the ADC and a third clock signal to control the DSP and a fourth clock signal. The second, third and fourth clock signals have respective second, third and fourth clock frequencies related to the first clock frequency. The clock generator circuit is further configured to, in selected operation modes, apply a jitter sequence to jitter the second and/or third clock frequency around a mean frequency value based on a predictable, periodic pseudo-random number sequence.

The input buffer is configured to receive input data from the ADC and to store the input data where the input buffer has a write port being driven by the second clock signal and a read port being driven by the third clock signal. The input sample rate converter is configured to receive input data from the input buffer or the ADC an input sampling rate and to generate output data at an output sampling rate being a uniform sampling rate where the input sample rate converter is configured to provide the output data to the DSP.

The output sample rate converter is configured to receive input data from the DSP at an input sampling rate being a uniform sample rate and to generate output data at an output sampling rate matching the fourth clock frequency. The output buffer is configured to receive input data from the DSP or the output sample rate converter and to store the input data where the output buffer has a write port being driven by the third clock signal and a read port being driven by the fourth clock signal.

The set of bypass signal paths coupled to each of circuit elements including the input buffer, the input sample rate converter, the output sample rate converter and the output buffer. The set of bypass signal paths is selectively activated to bypass one or more of the circuit elements coupled thereto. The DSP therefore receives input data either from the ADC, or from the input buffer, or from the input sample rate converter. The DSP provides output data to either the output sample rate converter, to the output buffer or as the processed digital output signal.

In operation, the spur avoidance circuit is configured to operate in one or more operation modes selected from a collection of operation modes using the set of bypass signal paths to select or bypass one or more of the circuit elements. The spur avoidance circuit is operated in a first set of operation modes to shift the second, third, and fourth clock frequencies out of a wanted signal channel of the RF receiver and is configured in a second set of operation modes to spread the clock frequency of at least the third clock signal based on the predictable, periodic pseudo-random number sequence.

According to another aspect of the present invention, a method for reducing digital noise injection in a mixed-signal radio frequency (RF) receiver where the RF receiver receives an incoming RF signal, digitizing the incoming RF signal, processing the digitized data, and generating a processed digital output data, includes:

configuring the RF receiver to operate in a first operation mode to shift the clock frequencies of the digitizing step and the processing step out of the wanted signal channel;

configuring the RF receiver to operate in a second operation mode to shift the clock frequencies of the digitizing step and the processing step out of the wanted signal channel and to modify the sampling rate of digitized data from the digitizing step to a sampling rate of the processing step;

configuring the RF receiver to operate in a third operation mode to shift the clock frequencies of the processing step out of the wanted signal channel and greater than the second clock frequency, and further to store the digitized data in an input buffer before the processing step and to store the processed digital output data in an output buffer after the processing step;

configuring the RF receiver to operate in a fourth operation mode to apply a jitter sequence to jitter the clock frequency of the processing step around a mean frequency value based on a predictable, periodic pseudo-random number sequence, and further to store the digitized data in an input buffer before the processing step and to store the processed digital output data in an output buffer after the processing step; and configuring the RF receiver to operate in a fifth operation mode to apply the jitter sequence to jitter the clock frequency of the digitizing step and the processing step around the mean frequency value based on the predictable, periodic pseudo-random number sequence, the clock frequency of the digitizing step being offset in phase from the clock frequency of the processing step, and further to perform uniform resampling of the non-uniformly sampled digitized data from the digitizing step to a uniform sampling rate before the processing step and to store the processed digital output data in an output buffer after the processing step.

The present invention is better understood upon consideration of the detailed description below and the accompanying drawings.

DETAILED DESCRIPTION OF THE PREFERRED EMBODIMENTS

In accordance with the principles of the present invention, a mixed-signal radio frequency receiver implements multiple spur avoidance modes to reduce or remove spurs or digital noise injection into the received channel to enhance the receiver performance. In particular, the multiple spur avoidance modes are reconfigurable to allow a single mode or multiple modes to be selected for use at one time depending on the application. One or more spur avoidance modes can be selected to enhance the performance of the receiver or the modes can be selected to reduce power consumption. A particular advantage of the multi-mode spur avoidance scheme of the present invention is that the same spur avoidance circuit is used to support all of the spur avoidance modes by reconfiguring the circuit for each mode or each combination of modes. Thus, implementation of the multiple spur avoidance modes is silicon area efficient. The RF receiver implementing the multi-mode spur avoidance scheme is particularly useful in applications where high signal-to-noise ratio (SNR) is demanded, such as an SNR of 50 dB or greater as required in analog format television signals.

The multi-mode spur avoidance scheme can be adapted to multi-channels and/or wideband signal receivers. A particular advantage of the multi-mode spur avoidance scheme of the present invention is that the spur avoidance modes are reconfigurable to apply to applications requiring low SNR to applications requiring very high SNR. More specifically, the multi-mode spur avoidance scheme can be configured for applications that require low SNR, such as satellite reception (8-9 dB SNR). When the SNR demand is low, the spur avoidance modes can be configured for reduced power consumption or improved efficiency. Meanwhile, the multi-mode spur avoidance scheme is particularly useful in applications that require very high SNR, such as television broadcast, where 55 dB weighted video SNR is typically required for analog format television signal. The multi-mode spur avoidance scheme is capable of removing spur-induced noise or visual artifacts without adding new source of noise. When a high SNR is required, conventional spur avoidance techniques such as uncompensated simple clock spreading on the system clock are usually inadequate to meet the SNR requirement.

According to another aspect of the present invention, a clock masking scheme is applied to align clock edges so that the clock edges do not collide with sampling moments of sensitive analog circuitry. In this manner, digital noise injection into high-performance sensitive analog circuitry, such as analog PLL, analog-to-digital or digital-to-analog converters, is significantly reduced.

Conventional RF Receiver Architecture

Figure 1:
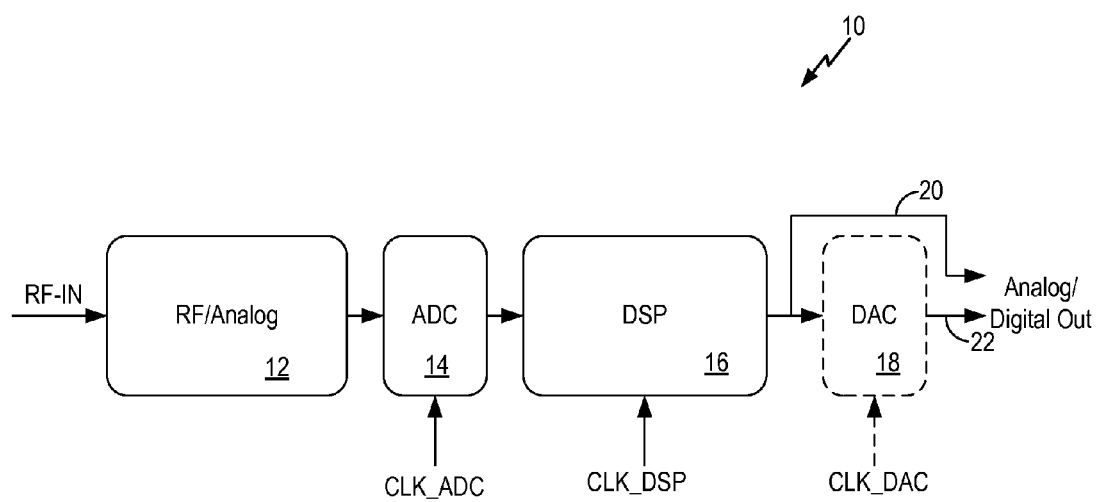
FIG. 1 is a schematic diagram illustrating the general architecture of a conventional mixed-signal RF receiver.

FIG. 1 is a schematic diagram illustrating the general architecture of a conventional mixed-signal RF receiver. Referring to FIG. 1, a mixed-signal RF receiver 10 includes an RF/Analog front-end circuit 12 that receives an incoming RF input signal (RF-IN) selects a channel from the incoming analog RF signal and converts the selected channel signal to a low intermediate frequency (IF) signal. The IF signal is then digitized by an analog-to-digital converter (ADC) 14. The digitized IF signal is then processed entirely in the digital domain by a digital signal processing (DSP) circuit 16. The DSP circuit 16 operates based on the assumption that it is receiving digitized data from the ADC 14 at a given ADC sampling rate which is the frequency at which the analog data (the IF signal) are sampled and digitized. The sampling rate of the digitized data corresponds to the rate of an ADC clock signal (CLK_ADC) used to clock the ADC 14. Meanwhile, the DSP circuit 16 is clocked at a DSP clock rate defined by a DSP clock signal (CLK_DSP) and operates at a native DSP sampling rate (or DSP sampling frequency) which can be chosen independently of the sampling rate of the ADC. Furthermore, the DSP sampling rate is based on the DSP clock signal but may be different from the DSP clock rate. The DSP clock signal corresponds to the clock signal that drives the data/memories pipeline and control registers in the DSP circuit 16. More specifically, the DSP can operate using one or more internal sampling rates where the one or more internal sampling rates are all related to or derived from the native DSP sampling rate. The DSP internal sampling rates will vary in accordance with the native sampling rate. For example, the DSP may include a decimation/upsampling stage operating at a given internal sampling rate and the DSP may use a DSP output sampling rate to output the processed data.

After digital processing, the channel information is either sent out of the receiver in the form of a digital data stream (signal path 20) or, in some cases, is provided to a digital-to-analog converter (DAC) 18 to be reconverted back to the analog domain so that the signal is sent out of the receiver as analog signals (signal path 22). In some embodiments, the receiver 50 can provide a digital output, an analog output, or a combination of digital and analog output indicative of the processed channel information. Common DAC architectures generally convert the digital signals back to analog signals at a sampling rate determined by the clock rate of a DAC clock signal (CLK_DAC). The DSP circuit 16 generally includes at the end of its processing pipeline some kind of sample rate adjustment in order to meet the DAC sampling rate.

The operation of the DSP circuit 16 generates digital noise or spurs at the DSP clock frequency and its harmonics as the transistors in the DSP circuit switch at the clock rate of the DSP clock. The spurs thus generated are often coupled to the sensitive analog circuits of the receiver 10, resulting in undesired image artifacts. Furthermore, when the spurs are injected during the sampling time of the ADC or the conversion time of the DAC, the performance of the digital conversion or analog conversion can be adversely impacted. The multi-mode spur avoidance scheme of the present invention is implemented in a mixed-signal receiver to mitigate the performance degradation due to digital noise injection from switching transistors of the digital circuitry.

RF Receiver Architecture Implementing Multi-Mode Spur Avoidance

Figure 2:
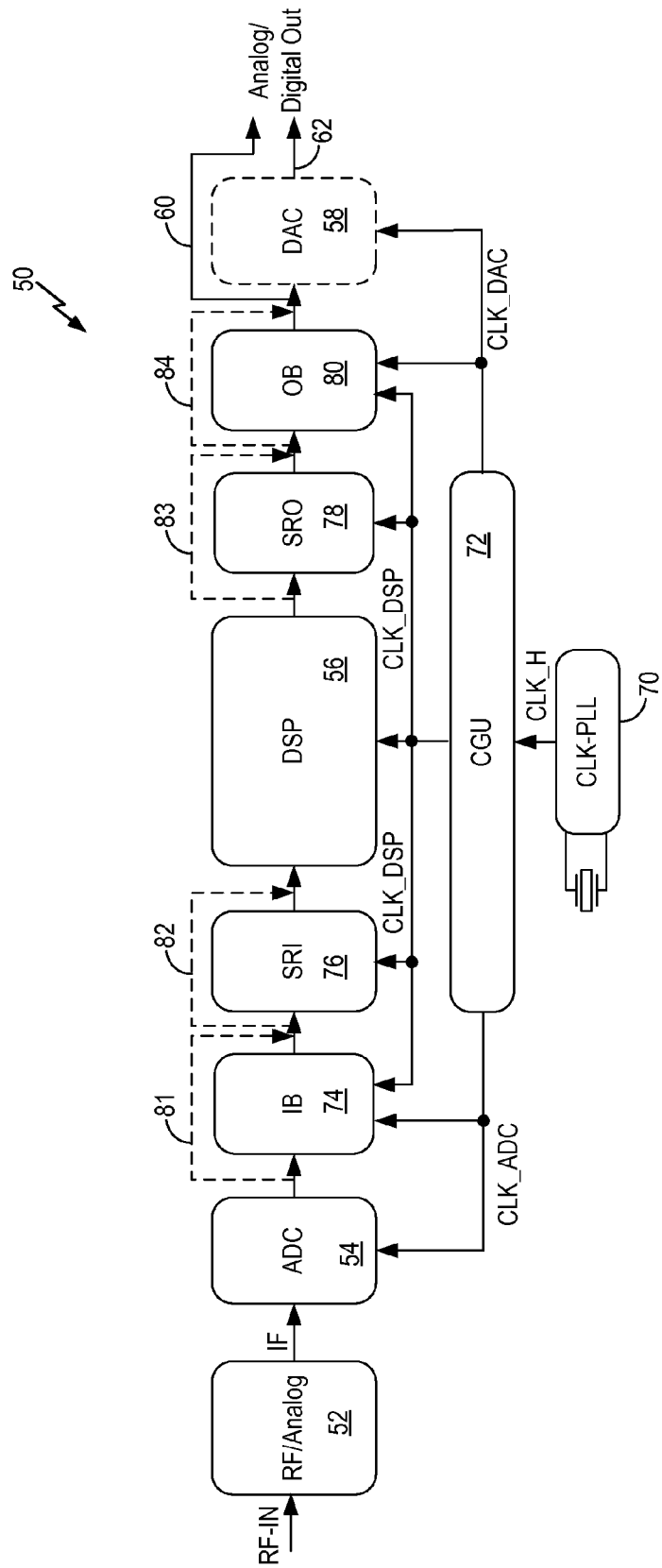
FIG. 2 is a schematic diagram of a mixed-signal RF receiver incorporating reconfigurable multi-mode spur avoidance circuitry according to one embodiment of the present invention.

FIG. 2 is a schematic diagram of a mixed-signal RF receiver incorporating reconfigurable multi-mode spur avoidance circuitry according to one embodiment of the present invention. Referring to FIG. 2, a mixed-signal RF receive 50 includes a RF/Analog front-end circuit 52 configured to select a channel from the incoming analog RF signal RF-IN and convert the selected channel signal to a low intermediate frequency (IF) signal, an analog-to-digital converter (ADC) 54 configured to digitize the IF signal, and a digital signal processing (DSP) circuit 56 for processing the digitized IF signal. After digital processing, the processed channel information can be sent out of the receiver in the form of a digital data stream on a signal path 60. In some embodiments, the processed channel information is provided to a digital-to-analog converter (DAC) 58 to be reconverted back to the analog domain so that the signal can be sent out of the receiver as analog signals on a signal path 62. The operation of the RF/Analog front-end circuit 52, the ADC 54, the DSP 56 and the DAC 58 in receiver 50 for receiving and processing incoming RF signals is similar to that of conventional mixed-signal receivers, such as receiver 10 of FIG. 1. DAC 58 is optional and is only needed when output data in the analog domain is required.

According to embodiments of the present invention, RF receiver 50 incorporates a reconfigurable multi-mode spur avoidance circuit to implement the multi-mode spur avoidance scheme. The multi-mode spur avoidance circuit includes a clock synthesizer circuit 70 and a clock generator circuit (CGU) 72 which together generates clock signals to drive the digital circuitry in receiver 50. The multi-mode spur avoidance circuit further includes an input buffer (IB) 74 and a dual operating mode input sample rate converter (SRI) 76 coupled between the output of the ADC 54 and the input to the DSP 56 of the receiver 50. The multi-mode spur avoidance circuit also includes an output sample rate converter (SRO) 78 and an output buffer (OB) 80 coupled between the output of the DSP 56 and the output of the receiver (signal path 60) or the input to the DAC 58. Importantly, the input buffer 74, SRI 76, SRO 78 and the output buffer 80 can be selectively bypassed using bypass signal paths 81 to 84. The bypass signal paths 81 to 84 enables the multi-mode spur avoidance circuit to be reconfigured in different spur avoidance modes to optimize different performance parameters, such as enhancing receiver performance or reducing power consumption. In embodiments of the present invention, the DSP circuit 56 is configured to operate in a data-driven manner, that is, the data pipelines of the DPS are updated only when new valid data are being pushed into the DSP circuit, as signaled by internal control signals, such as a collection of data strobe/valid signals.

As thus configured, the clock synthesizer circuit 70 generates a clock signal (CLK_H) for the CGU 72 which uses the clock signal CLK_H to generate the various clock signals used in receiver 50. In one embodiment, the clock synthesizer circuit 70 is a clock phase-locked loop (PLL) and generates a high frequency clock signal CLK_H that can be programmed to fit a limited tuning range. The CGU 72 receives the high frequency clock signal CLK_H and in turn generates a ADC clock (CLK_ADC) for driving the ADC 54, a DSP clock (CLK_DSP) for driving the DSP 56, and when needed, a DAC clock (CLK_DAC) for driving the DAC 58. In particular, the CGU 72 generates the ADC clock signal to drive the sampling clock input of the ADC 54, thereby controlling the sampling rate of the ADC. The CGU also generates the DSP clock which drives the DSP to control all of the DSP activity. Finally, the CGU 72 generates the DAC clock signal, where applicable, to drive the sampling clock input of the DAC 58 when the processed channel data needs to be converted back to the analog domain.

The ADC clock signal, the DSP clock signal and the DAC clock signal generated by the CGU 72 are also used to drive the other circuit blocks of the spur avoidance circuit. More specifically, the input buffer 74 is driven by both the ADC clock signal and the DSP clock signal, while the output buffer 80 is driven by the DSP clock signal and, where applicable, the DAC clock signal. The DSP clock signal is also coupled to drive the input sample rate converter 76 and the output sample rate converter 78.

In embodiments of the present invention, the input buffer 74 is implemented as a multi-rate dual-port input buffer. As thus configured, digitized data from the ADC 54 is written into the input buffer 74 and the digitized data is read out of the input buffer 74 by either the input sample rate converter 76 or the DSP 56. Thus, the ADC clock is coupled to drive the write clock port of the dual-port input buffer so that data is written into the input buffer at the sampling rate of the ADC 54. Meanwhile, the DSP clock is coupled to drive the read clock port of the dual-port input buffer so that data is read out from the input buffer at the clock rate of the DSP 56.

In embodiments of the present invention, the output buffer 80 is implemented as a multi-rate dual-port input buffer. As thus configured, processed channel information from the DSP 56 or the output sample rate converter 78 is written into the output buffer 80 and the processed data is read out of the output buffer 80 either directly as the output digital data stream on signal path 60 or through DAC 58 as analog output data on signal path 62. Thus, the DSP clock is coupled to drive the write clock port of the dual-port output buffer so that data is written into the output buffer at the clock rate of the DSP 56. In the present illustration, the DAC clock is coupled to drive the read clock port of the dual-port output buffer so that data is read out from the output buffer at the sampling rate of the DAC 58. In embodiments where the receiver 50 provides only a digital data stream as output and no DAC circuit is included, the read clock port of the dual-port output buffer may be driven by other clock signals having a frequency suitable for the system receiving the digital data stream.

The input sample rate converter 76 and the output sample rate converter 78 are provided on the input side and the output sides, respectively, of the DSP 56 and they are clocked by the same DSP clock. The input and output sample rate converters 76, 78 operate to convert incoming data to the DSP or outgoing data from the DSP between the sampling rate of the DSP and the sampling rate of the surrounding circuitry, as will be described in more detail below.

Multi-Mode Spur Avoidance Circuit

The following description illustrates embodiments for implementing various circuit blocks of the multi-mode spur avoidance circuit. The present description is illustrative only and is not intended to be limiting. The circuit blocks of the multi-mode spur avoidance circuit may be implemented in other manners and other implementations of the circuit blocks are within the scope of the present invention.

Clock Synthesizer Circuit and Clock Generator Circuit

Figure 3:
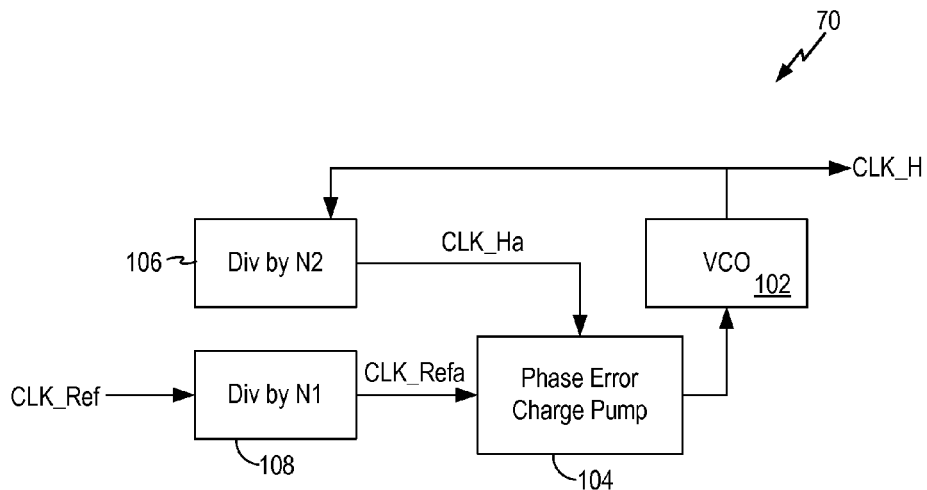
FIG. 3 is a schematic diagram of a clock synthesizer circuit which can be incorporated in the multi-mode spur avoidance circuit according to one embodiment of the present invention.
Figure 4:
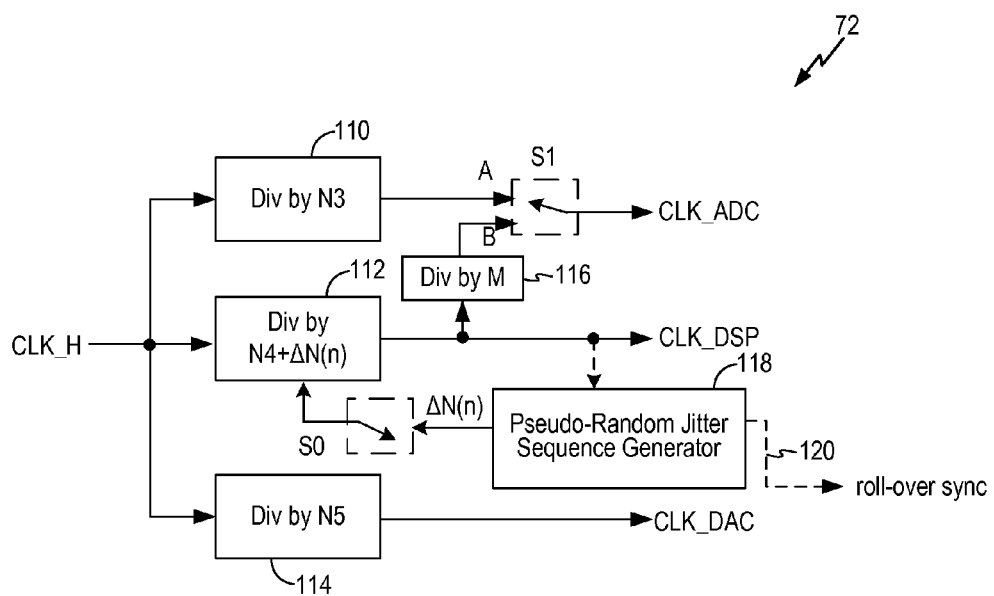
FIG. 4 is a schematic diagram of a clock generator circuit (CGU) which can be incorporated in the multi-mode spur avoidance circuit according to one embodiment of the present invention.

FIG. 3 is a schematic diagram of a clock synthesizer circuit which can be incorporated in the multi-mode spur avoidance circuit according to one embodiment of the present invention. FIG. 4 is a schematic diagram of a clock generator circuit (CGU) which can be incorporated in the multi-mode spur avoidance circuit according to one embodiment of the present invention. Referring first to FIG. 3, in the present embodiment, the clock synthesizer circuit 70 is implemented as a clock phase-locked loop (PLL) and will be referred hereinafter as "clock PLL 70." Clock PLL 70 includes a voltage-control oscillator (VCO) 102 to synthesize a high frequency clock signal CLK_H which is supplied to the CGU for clock generation. In clock PLL 70, the clock signal CLK_H is coupled to a clock divider 106 to be divided by a clock division factor N2 to generate a divided-down clock signal CLK_Ha which is to be compared in phase to a clock signal CLK_Refa derived from a reference clock signal (CLK_Ref) divided by a clock division factor N1 generated at a clock divider 108. The error between the feedback clock signal CLK_Ha and the reference clock signal CLK_Refa is fed back to the VCO 102 to form a feedback loop. In one embodiment, the comparator is a phase error charge pump 104. The values of clock division factors N1 and N2 are controlled digitally so that by varying one or both of the clock division factors, the oscillating frequency of the output clock signal CLK_H can be controlled.

Referring now to FIG. 4, the high frequency clock signal CLK_H from the clock PLL 70 is provided as an input clock signal to the CGU 72. In CGU 72, the clock signal CLK_H is coupled to a series of clock dividers 110, 112 and 114. At clock divider 110, the clock signal CLK_H is divided by a constant clock division factor N3. At clock divider 114, the clock signal CK_H is divided by a constant clock division factor N5 that generates the clock signal CLK_DAC. In one embodiment, constant clock division factors N3 and N5 are user-programmed values. At clock divider 112, the clock signal CLK_H is divided by a time-varying clock division factor $(N4+\Delta N(n))$ that generates the DSP clock signal CLK_DSP.

The ADC clock signal CLK_ADC can be either a clock signal A being the output of the clock divider 110 or a clock signal B being a divided-down DSP clock signal. The divided-down DSP clock signal is generated by a clock divider 116 receiving the DSP clock signal and having a clock division factor M. In one embodiment, a switch S1 selects either the output of clock divider 110 (clock signal A) or the output of clock divider 116 (clock signal B). In embodiments of the present invention, the clock division factor M is preferably an integer value so that the edges of clock signals CLK_ADC and CLK_DSP are kept aligned when clock signal B is selected for the ADC clock.

At clock divider 112, the time-varying clock division factor $(N4+\Delta N(n))$ is the sum of a constant clock division factor N4 and a time-varying differential value $\Delta N(n)$. The time-varying clock division factor $(N4+\Delta N(n))$ is updated with a new value each time a CLK_DSP pulse is generated. Clock division factor N4 is the mean value of the time varying clock division factor and may be user-programmed in embodiments of the present invention. In the present embodiment, a switch S0 connects the differential value $\Delta N(n)$ to the clock divider 112 so that the differential value can be selectively applied to clock divider 112. Thus, clock divider 112 may generate a DSP clock signal (CLK_DPS) having a constant clock period by keeping switch S0 open and thereby not applying the differential value $\Delta N(n)$. The DSP clock signal thus has a clock period determined by the constant clock division factor N4. Alternately, the clock divider 112 may generate a DSP clock signal with instantaneous period variation around a given mean period by keeping switch S0 closed to apply the differential value $\Delta N(n)$ to the clock divider. The DSP clock signal thus has a clock period determined by the time-varying clock division factor $(N4+\Delta N(n))$ with mean clock period determined by the division factor N4 and the instantaneous period variation determined by the differential value $\Delta N(n)$.

In embodiments of the present invention, the differential value $\Delta N(n)$ is a pseudo-random sequence of discrete numbers. More specifically, in one embodiment, the differential value $\Delta N(n)$ is a series of integer numbers belonging to the range defined by $\{-K, -(K-1), \ldots -1, +1, \ldots +(K-1), +K\}$ with a mean of zero. In the present embodiment, the series of integer numbers is generated by a pseudo-random number generator (PRNG) 118, also referred to as the pseudo-random jitter sequence generator. The DSP clock signal CLK_DSP is coupled to drive the PRNG 118 so that the pseudo-random number generator updates its output every CLK_DSP clock cycle. Accordingly, a new differential value $\Delta N(n)$ is generated each time a CLK_DSP clock pulse is generated. Furthermore, in embodiments of the present invention, the pseudo-random number generator repeats the pseudo-random sequence of integer numbers at a low cycle rate to generate a predictable, periodic pseudo-random number sequence, referred herein as a "jitter sequence." In one embodiment, the repetition of the pseudo-random sequence of integer numbers is detected and signaled on a roll-over sync signal (node 120) which is used by other circuit blocks of the spur avoidance circuit, as will be explained in more detail below.

In the present description, a clock divider with a clock division factor of W refers to a clock divider circuit configured to generate an output clock with a period that is W times the period of the input clock. In one embodiment, the clock divider may be implemented as a decrementing counter clocked on the input clock (e.g. CLK_H). When the count reaches zero, the clock divider toggles the value of a one bit output clock signal and reload the counter internal value to W/2. In the case W is an odd number, a one-cycle adjustment may be used in the counter reload value.

As thus configured, the clock PLL 70 generates the high frequency clock signal CLK_H which is used by the CGU 72 to generate the various clock signals used by the receiver circuit, including the ADC clock signal CLK_ADC, the DSP clock signal CLK_DSP and the DAC clock signal CLK_DAC. The clock divider 114 to generate the DAC clock signal is optional and may be omitted when the receiver does not require a DAC circuit to convert digital signals back to the analog domain. In other embodiments, clock divider 114 can be used to generate an auxiliary clock signal for driving other circuit blocks of the receiver circuit and the multi-mode spur avoidance circuit even when a DAC circuit is not included.

Input Buffer and Output Buffer

Figure 5:
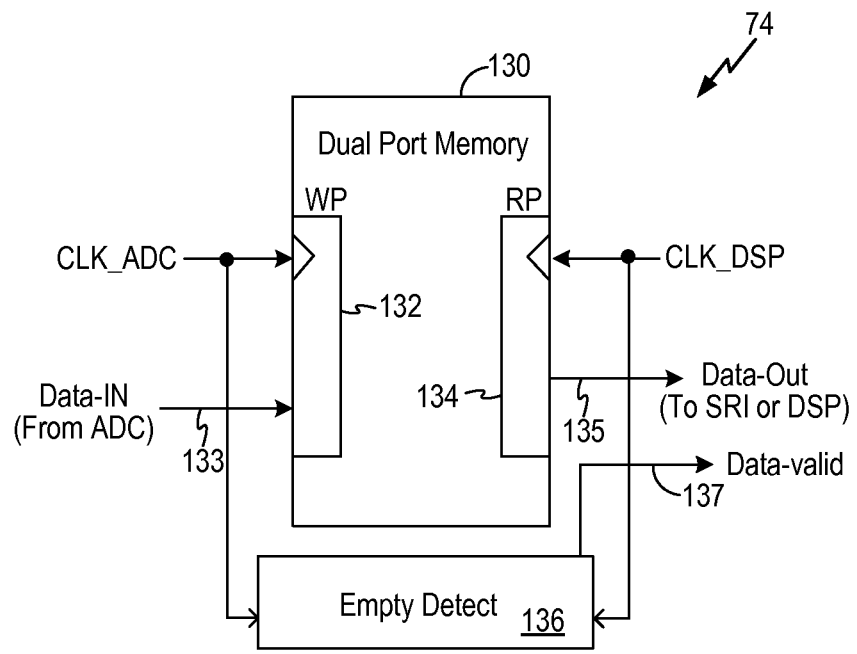
FIG. 5 is a schematic diagram of an input buffer which can be incorporated in the multi-mode spur avoidance circuit according to one embodiment of the present invention.
Figure 6:
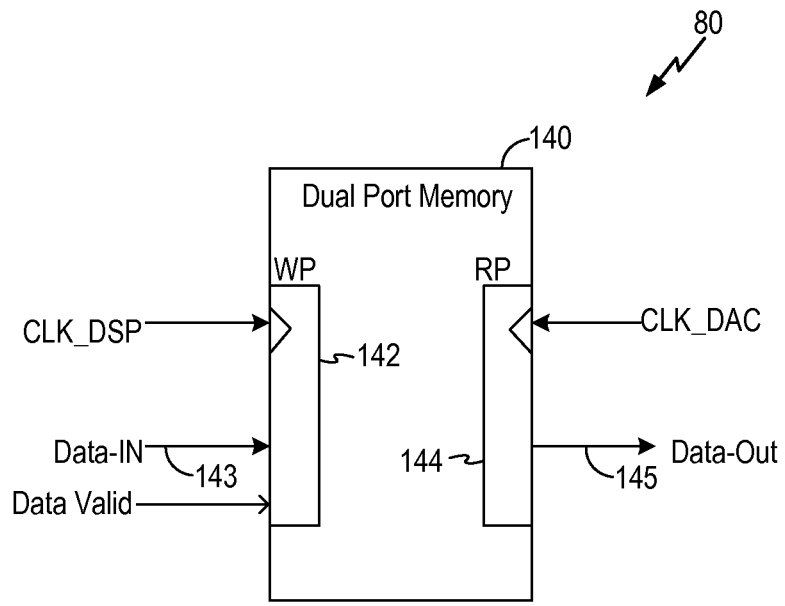
FIG. 6 is a schematic diagram of an output buffer which can be incorporated in the multi-mode spur avoidance circuit according to one embodiment of the present invention.

FIG. 5 is a schematic diagram of an input buffer which can be incorporated in the multi-mode spur avoidance circuit according to one embodiment of the present invention. FIG. 6 is a schematic diagram of an output buffer which can be incorporated in the multi-mode spur avoidance circuit according to one embodiment of the present invention. Referring first to FIG. 5, the input buffer 74 includes a dual-port memory circuit 130 with asynchronous write and read ports 132, 134. In some embodiments, the dual-port memory circuit 130 can be implemented as a random-access memory or as registers. The write port (WP) 132 of the dual-port memory circuit 130 is driven by the ADC clock signal CLK_ADC as the write clock. Incoming data from the ADC 54, which is provided on the Data_In bus 133, is written into the memory circuit 130 continuously at the ADC clock rate. Meanwhile, the read port (RP) 134 of the dual-port memory circuit 130 is driven by the DSP clock signal CLK_DSP as the read clock. Stored data is read out of the memory circuit onto the Data_Out bus 135 at the DSP clock rate either continuously or in a discontinuous manner. The data read out of the read port 134 may be provided to SRI 76 or to the DSP 56 directly.

The input buffer 74 further includes an empty detect circuit 136 configured to generate a data_valid signal (node 137) to indicate when valid data are present in the memory circuit 130 of the input buffer 74 which may be read out from the read port 134 at the DSP clock rate. In some embodiments, the empty detect circuit 136 is also asserted to indicate that the data are valid on the Data_Out bus 135. The empty detect circuit 136 determines when the memory circuit 130 of the input buffer is empty by comparing the write clock rate (the ADC clock) and the read clock rate (the DSP clock).

In embodiments of the present invention, the input buffer 74 is applied in one or more of the spur avoidance modes depending on the relationship between the write clock (CLK_ADC) and the read clock (CLK_DSP). First, when the read clock matches the write clock, that is, CLK_ADC and CLK_DSP have the same frequency or clock rate, the reading of stored data occurs at the same rate as the writing of incoming data. In this case, the input buffer 74 can be bypassed, such as using bypass signal path 81. Alternately, the input buffer 74 may be kept in the signal path of the receiver to facilitate clock-domain crossing.

Second, in some cases, the read clock (CLK_DSP) only matches the write clock rate (CLK_ADC) in average over a fixed, predetermined rolling period. In that case, while the instantaneous period of the write clock (CLK_ADC) is constant and is equal to the inverse of the ADC sampling rate, the period of the read clock (CLK_DSP) may be changing from cycle to cycle as a random variable centered around the constant period of the write clock (CLK_ADC) with a maximum cycle-to-cycle jitter determined by the differential value $\Delta N(n)$. More specifically, in this case, the DSP clock signal is generated at the CGU 72 by using the time-varying differential factor $\Delta N(n)$, that is, switch S0 closed, so that the DSP clock signal has a clock frequency that varies according to the periodic pseudo-random number sequence generated by PRNG 118. Thus, the clock edges of the DSP clock (the read clock) varies in a deterministic and reproducible manner as controlled by the CGU 72. In embodiments of the present invention, the input buffer 74 is provided with a memory size sufficient to store enough data to absorb the local clock rate variation of the read clock (CLK_DSP) compared to the write clock (CLK_ADC), so that no buffer overflow/underflow occurs and no data is lost.

Third, in some cases, the read clock (CLK_DSP), either with a constant clock period or with instantaneous period variation around a given mean period, runs faster than the write clock (CLK_ADC). Thus, the reading of the stored data occurs at a faster rate than the writing of new incoming data. In this case, no incoming ADC data would be lost but the input buffer 74 may be empty most of the time. When the input buffer is not empty, the data_valid signal (node 137) is asserted for every DSP clock cycle. However, when the input buffer becomes empty, the empty detect circuit 136 operates to inject spare cycles to the data_valid signal to indicate that not every DSP clock cycle carries valid data.

Referring now to FIG. 6, the output buffer 80 includes a dual-port memory circuit 140 with asynchronous write and read ports 142, 144. In some embodiments, the dual-port memory circuit 140 can be implemented as a random-access memory or as registers. The write port (WP) 142 of the dual-port memory circuit 140 is driven by the DSP clock signal CLK_DSP as the write clock. Incoming data from the DSP 56, with or without passing through output sample rate converter 78, is provided on the Data_In bus 143 to be written into the memory circuit 140 either continuously or in a discontinuous manner. Meanwhile, the read port (RP) 144 of the dual-port memory circuit 140 is driven by the DAC clock signal CLK_DAC as the read clock. Stored data is read out of the memory circuit onto the Data_Out bus 145 at the DAC clock rate in a continuous manner. The data read out of the output buffer 80 is fed to the DAC 58, where applicable, at a constant sampling rate equal to the DAC clock rate. As described above, when the receiver 50 does not include a DAC circuit, the read clock of the output buffer 80 can be driven by an appropriate clock signal and the stored data can be read out as a digital data stream. The memory circuit 140 also receives the data_valid signal from the input buffer 74.

In embodiments of the present invention, the output buffer 80 is applied in one or more of the spur avoidance modes depending on the relationship between the write clock (CLK_DSP) and the read clock (CLK_DAC). First, when the read clock matches the write clock, that is, CLK_DSP and CLK_DAC have the same frequency or clock rate, the reading of stored data occurs at the same rate as the writing of incoming data. This can occur when switch S0 in the CGU 72 (FIG. 4) is open so that the clock divider 112, generating the DSP clock signal, uses a constant clock division factors N4 only and the clock division factor N4 equals the clock division factor N5 for generating the DAC clock signal (i.e., N4=N5). In this case, the output buffer 80 can be bypassed, such as using bypass signal path 84. Alternately, the output buffer 80 may be kept in the signal path of the receiver to facilitate clock-domain crossing.

Second, in some cases, the read clock (CLK_DAC) only matches the write clock rate (CLK_DSP) in average over a fixed, predetermined rolling period. In that case, while the instantaneous period of the read clock (CLK_DAC) is constant and is equal to the inverse of the DAC sampling rate, the period of the write clock (CLK_DSP) changes from cycle to cycle as a random variable centered around the constant period of the read clock (CLK_DAC) with a maximum cycle-to-cycle jitter determined by the differential value $\Delta N(n)$. In the same manner as described above, the clock edges of the DSP clock (the write clock) varies in a deterministic and reproducible manner as controlled by the CGU 72. In embodiments of the present invention, the output buffer 80 is provided with a memory size sufficient to store enough data to absorb the local clock rate variation of the write clock (CLK_DSP) compared to the read clock (CLK_DAC), so that no buffer overflow/underflow occurs and no data is lost.

Third, in some cases, the write clock (CLK_DSP), either with a constant clock period or with instantaneous period variation around a given mean period, runs faster than the read clock (CLK_DAC). Thus, the writing of the incoming data occurs at a faster rate than the reading of the stored data. However, not every CLK_DSP cycle carries valid data and the output buffer 80 relies on the data_valid signal to update the memory circuit 140 with new data only. In one embodiment, the data_valid signal is clocked at a rate that matches exactly the read clock CLK_DAC rate in average over a fixed, predetermined period. The output buffer 80 does not require any empty detection circuitry but the memory size of the output buffer should be large enough to store enough data to absorb local data_valid signal rate variation to provide continuous data to the DAC 58.

Figure 7:
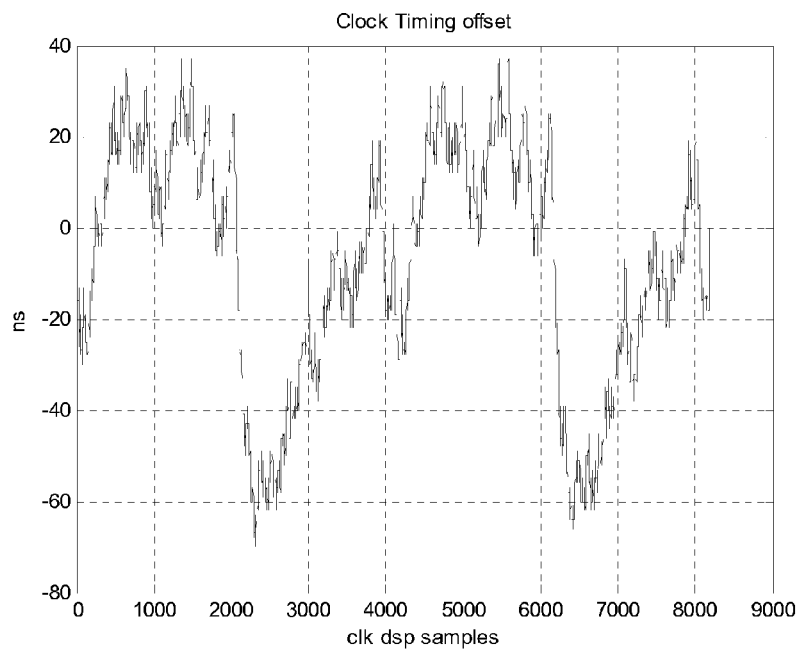
FIG. 7 is a diagram illustrating the timing edge offsets of the DSP clock signal with or without spreading from the jitter sequence according to one embodiment of the present invention.

FIG. 7 is a diagram illustrating the timing edge offsets of the DSP clock signal with or without spreading from the jitter sequence according to one embodiment of the present invention. In the present exemplary embodiment, the jitter sequence generator (PRNG) 118 is implemented as a 12-bits Linear-Feedback-Shifted-Register (LFSR) with L=12 and K=2, where L represents the length of the shift registers and K is the number range of the jitter sequence. The DSP clock edge varies over a periodic cycle of 4096 samples between about +40 ns offset to about −70 ns offset relative to the non-spread DSP clock. However, the variation of the DSP clock edge is deterministic and reproducible so that sufficient buffer size can be allocated to the input buffer and the output buffer to store and generate data to guarantee that no samples are lost even when the read/write clock is at the slowest/ highest clock rate.

Input and Output Sample Rate Converters

In embodiments of the present invention, the input and output sample rate converters 76 and 78 are configured as processing circuits designed to convert a stream of incoming data at a first sampling rate into a stream of outgoing data at a different sampling rate. In other words, the outgoing data stream is shifted in time relative to the incoming data stream. In the present description, the sample rate conversion encompasses mechanisms such as fractional delay, sample rate conversion and non-uniform sampling reconstruction for converting the sampling rate/moment of the input data stream.

Figure 8:
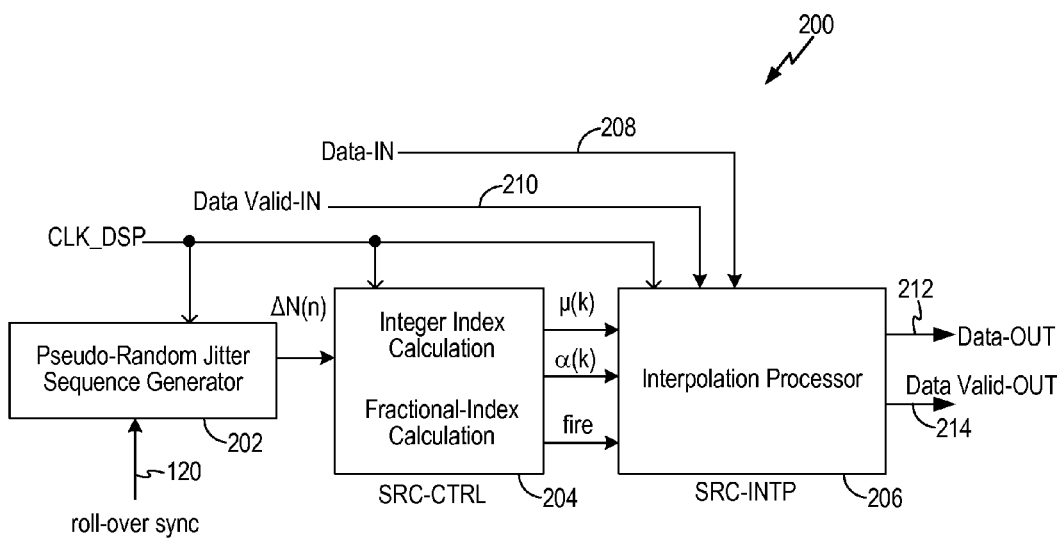
FIG. 8 is a schematic diagram of a fractional delay calculator which can be used to implement either the input sample rate converter or the output sample rate converter according to one embodiment of the present invention.

FIG. 8 is a schematic diagram of a fractional delay calculator which can be used to implement either the input sample rate converter or the output sample rate converter according to one embodiment of the present invention. In embodiments of the present invention, the fractional delay calculator can be configured to operate as a uniform resampler circuit to operate on the digital data generated by the ADC, as will be explained in more detail below. Referring to FIG. 8, a sample rate converter 200 includes a pseudo-random number generator (PRNG) 202 (also referred to as a "pseudo-random jitter sequence generator"), a control circuit (SRC-CTRL) 204, and an interpolation processor (SRC-INTP) 206. The PRNG 202 receives the roll-over sync signal from the PRNG 118 of the CGU 72 (FIG. 4) and is driven by the DSP clock signal (CLK_DSP). PRNG 202 generates the same periodic pseudo-random number sequence (or jitter sequence) as PRNG 118 and the two number sequences are synchronized by the roll-over sync signal. Accordingly, the PRNG 202 generates the same time-varying differential value $\Delta N(n)$ at the clock rate of the DSP clock signal where the differential value $\Delta N(n)$ is provided to the control circuit 204. PRNG 202 is required only when the sample rate converter performs non-uniform sampling reconstruction, as will be explained in more detail below.

The control circuit (SRC-CTRL) 204, also driven by the DSP clock signal, is operative to determine the integer position of the neighboring samples as well as the fractional position of the sample to be reconstructed relative to the incoming data stream. A fractional position index $\mu(k)$ and an integer position index $\alpha(k)$ are generated by the control circuit 204 and provided to the interpolation processor 206. The integer position index gives information of which neighboring samples from the original sequence need to be considered for interpolation of the current sample. Furthermore, in the present embodiment, the control circuit 204 generates a "fire" signal for the interpolation processor 206 to indicate when a new sample should be generated.

The interpolation processor (SRC-INTP) 206 performs interpolation or filtering of the input data stream (Data_In 208) based on the fractional position index $\mu(k)$ and the integer position index $\alpha(k)$ to generate the output data stream Data_Out 212 using conversion mechanisms, presently known or to be developed. In embodiments of the present invention, sample interpolation can be carried out using Newton interpolation structures or using the Farrow structure. Newton interpolation structures refer to the interpolation formula described in "Structures for Interpolation, Decimation and Nonuniform Sampling Based on Newton's Interpolation Formula", Vesa Lehtinen and Markku Renfors, SAMPTA '09, Marseille, France (2009), which reference is incorporated herein by reference in its entirety. The Farrow structure is described in "Reconstruction of Non-Uniformly Sampled Signal Using Transposed Farrow Structure", Djorde Babic and Markku Renfors, ISCAS 2004, Vol. III pp. 221-224, which reference is incorporated herein by reference in its entirety. The interpolation scheme can be chosen to be direct or transposed. In one embodiment, the input sample rate converter (SRI) 76 is implemented using a transposed conversion structure because of its anti-aliasing property while the output sample rate converter (SRO) 78 is implemented using a direct conversion implementation as an anti-imaging interpolator. The interpolation processor 206 also receives a data_valid_in signal 210 and generates a data_valid_out signal 214. Data_valid_out signal 214 is used to indicate when a new data is generated from the interpolation processor.

In embodiments of the present invention, the input sample rate converter (SRI) 76 includes a control circuit 204 configured to operate in a sample rate conversion mode and a fractional delay adjustment mode. When the control circuit 204 in SRI 76 is configured in the sample rate conversion mode as a sample rate converter, the input data stream 208 arrives at a constant or uniform sampling rate as determined by the ADC clock signal and the input data stream 208 is converted to an output data stream 212 at a fixed constant or uniform sampling rate Fout_target suitable for the DSP that follows, which is the native DSP sampling rate or an internal DSP sampling rate related to the native DSP sampling rate. In this mode, the generation of the fractional position index μ(k) and the integer position index α(k) is derived by two running counters that are updated at the input and output sampling rates as follows:

$$\mu(k) = \text{ceil}[k*Tin/Tout] - k*Tin/Tout,$$

where ceil[x] denotes the ceiling function and provides the next higher integer of x,
Tin=1/Fin (Fin=sampling frequency of the ADC or $f_{ADC}$=1/CLK_ADC), and
Tout=1/Fout_target (Fout_target=native DSP sample rate), where both Fin and Fout are constant values.

On the other hand, when the control circuit in SRI 76 is configured in the fractional delay adjustment mode to perform non-uniform sampling reconstruction, the output sampling rate (i.e., the DSP sampling rate) is uniform while the input sampling rate (being the actual sampling rate of ADC) is non-uniform. In particularly, the ADC clock may be jittered so that the input sampling rate to the SRI is equal on average to the native ADC sampling rate but with local sample distance variation due to injected sampling clock jitter on the ADC clock. Using the SyQuest reconstruction property, the input data stream may be reconstructed on a regular time grid by using the interpolation processor (SRC-INTP) 206. When thus configured, the SRI 76 operates as a uniform resampler circuit to perform uniform resampling of the non-uniformly sampled digitized data and to generate output data that are uniformly sampled.

In one embodiment, the control circuit 204 reconstructs the differential value ΔN(n) sequence as generated in the CGU 72 using the local PRNG 202. The PRNG 202 generates the same periodic pseudo-random number sequence as PRNG 118 of the CGU 72 as synchronized by the roll-over sync signal. Appropriate delay may be introduced to account for the latency from the ADC 54 to the SRI 76. The fractional position index μ(k) is given as follows:

$$\mu(k) = \text{ceil}[T(k)/*(M*Tout)] - T(k)/(M*Tout)$$

where Tout=1/Fout_target, and
M is the largest integer such that M*Tout<T(k); and $$T(k) = \sum_{i=0}^{k} (\text{Tin} + \Delta N(i)),$$

where the T(k) sequence represents the timing sequences of samples coming out of the ADC and Tin=1/Fin=1/Fout and is a constant.

In embodiments of the present invention, the output sample rate converter (SRO) 78 includes a control circuit 204 configured to operate in the sample rate conversion mode to convert the DSP sampling rate to the constant DAC sampling rate. More specifically, SRO 78 receives uniformly sampled processed data from the DSP and generates output data at the DAC sampling rate. In some embodiments, the SRO 78 operates to convert the DSP output sampling rate to the constant DAC sampling rate.

Pseudo-Random Number Generator

The pseudo-random number generator in CGU 72 and also duplicated in the sample rate converters may be implemented in various ways, presently known or to be developed, to generate the predictable pseudo-random number sequence. In the multi-mode spur avoidance circuit, the pseudo-random number generator is a digitally controlled system configured to generate a predictable and periodic pseudo-random sequence of integers. That is, the pseudo-random number generator generates a pseudo-random number sequence that can be repeated and reproduced by another similarly configured pseudo-random number generator as long as the two generators are synchronized.

Figure 9:
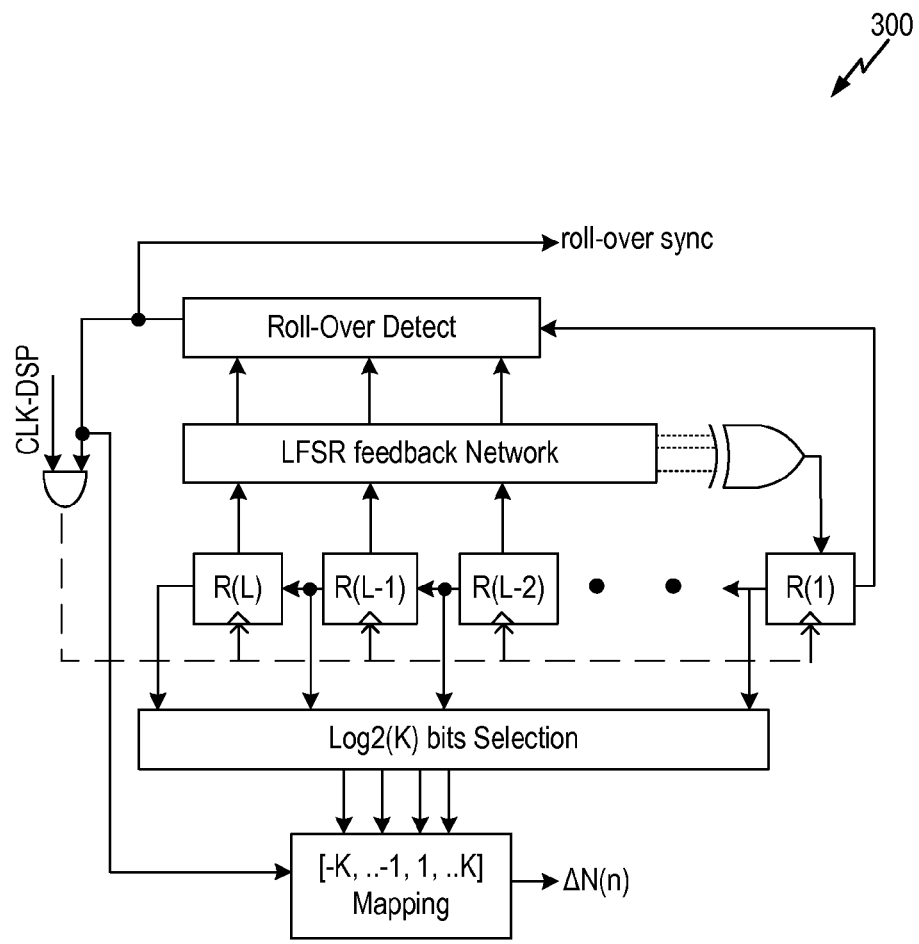
FIG. 9 is a schematic diagram of an LFSR-based pseudo-random number generator which can be incorporated in the multi-mode spur avoidance circuit according to embodiments of the present invention.

FIG. 9 is a schematic diagram of an LFSR-based pseudo-random number generator which can be incorporated in the multi-mode spur avoidance circuit according to embodiments of the present invention. Referring to FIG. 9, an LFSR-based pseudo-random number generator 300 includes a Linear-Feedback-Shifted-Register (LFSR) of a given length L to generate the number sequence for the differential value ΔN(n). By carefully choosing the feedback polynomial function, the LFSR structure will generate $2^L - 1$ random numbers of L bits (all-zero being excluded from the generated sequence) before recycling to its original value and the sequence repeats itself. The LFSR can be extended to $2^L$ cycles by detecting the roll-over point and gating the LFSR at that cycle. Depending on the pre-programmed K-value, $\text{Log}_2(K)$ bits are extracted from the LFSR register to be mapped on the number range {−K, −(K−1), ... −1, +1, ... +(K−1), +K} with the roll-over point detect signal to indicate that an artificial cycle was added for which a new ΔN(n) value is to be generated.

Using a modified cycle-extended LFSR of length L from which $\text{Log}_2(K)$ bits are extracted to form a signed number guarantees that the new ΔN(n) sequence will be pseudo-random, cyclic with a period of L, has a zero-mean value, bounded to [−K,+K] range and absolutely deterministic. Moreover, the roll-over sync signal detection can be used to synchronize a remote slave LFSR with the same parameters to regenerate locally the same exact ΔN(n) sequence. In some embodiments, the K and L values are selected to be programmable over a predetermined range. With appropriate selection of the K and L values, energy spreading as a result of the jitter sequence ΔN(n) can be realized for spur avoidance.

Spur Avoidance Modes

According to embodiments of the present invention, with the RF receiver 50 thus constructed to include the multi-mode spur avoidance circuit, the RF receiver 50 implement multiple spur avoidance modes to reduce spur-induced noise into the received channel. The multiple spur avoidance modes are selected based on the signal reception scenario to optimize the receiver performance in noise reduction or in power consumption. In embodiments of the present invention, a single spur avoidance mode may be selected or a combination of two or more spur avoidance modes may be used depending on the application. The spur avoidance modes are selected by reconfiguring the multi-mode spur avoidance circuit. Each spur avoidance mode may employ some but not all components of the multi-mode spur avoidance circuit. More specifically, the multiple spur avoidance modes are implemented by setting the values for the clock division factors N1, N2, N3, N4, N5 and M and setting the state of switches S0 and S1 in the clock PLL 70 and the CGU 72 and further selecting or deselecting the bypass signal paths 81-84 as well as configuring the SRI 76 to operate as a sample rate converter or a uniform resampler circuit.

In embodiments of the present invention, five spur avoidance modes are defined. The first three modes operate to offset the ADC clock and the DSP clock so as to "move" the spur out of the received channel. The fourth and fifth modes operate to spread the DSP clock to reduce the energy of the clock spur. The five spur avoidance modes will be described in detail with reference to FIGS. 2-4.

Mode 1—Change Clock Frequency without Sample Rate Conversion

The first spur avoidance mode (Mode 1) operates by changing or shifting the frequency of all of the clocks of the receiver, including the ADC clock, the DSP clock and the DAC clock, so that the clocks' frequency fundamental and/or harmonics do not fall inside the wanted signal channel. In particular, Mode 1 is applied when the clock frequency needs to be changed by only a small amount from the native clock frequency to move the spur-induced noise out of the wanted signal channel. In embodiments of the present invention, Mode 1 is applied when the clock frequency is offset by 1-2% for acceptable video quality and up to 5% for less stringent video quality applications, such as digital satellite reception.

In applications where the intended receive channel is at a high frequency, it may be possible to shift the clock frequency by a little to move the clock spurs out of the received channel. For example, assume a clock frequency of 32 MHz for the ADC clock and the DSP clock, if the receive channel is 96 MHz, the third order harmonic of the ADC/DSP clock will occur inside the desired received channel of 96 MHz. In that case, the first spur avoidance mode may be applied to shift the frequency of the ADC/DSP clock (and/or other clocks in the receiver) by a small amount so that the third order harmonic of the clock frequency will be shifted outside of the wanted receive channel. For example, the ADC/DSP clock frequency can be reduced to 31.25 MHz. In that case, the third order harmonic occurs at 93.75 MHz which is sufficiently outside of the wanted receive channel with a lower band limit of 94 MHz so that the spurs no longer come within and interfere with the wanted receive channel at 96 MHz.

In embodiments of the present invention, Mode 1 is implemented by slightly increasing or slightly decreasing the clock division factor N2 of clock divider 106 in the clock PLL 70, by selecting the bypass signal paths 81-84 to bypass the input buffer 74, the SRI 76, the SRO 78 and the output buffer 80, and by opening switch S0 to not apply the jitter sequence to the DSP clock. The switch S1 may select clock signal A or clock signal B depending on the application.

When the clock division factor N2 in the clock PLL 70 is changed, the clock frequency for clock signal CLK_H is changed accordingly. Because clock signal CLK_H is used to derive all the other clocks in receiver 50, changing the division factor N2 causes all of the clock signals, including the ADC clock, the DSP clock and the DAC clock, to also change frequency. By selecting an appropriate value for clock division factor N2, it is possible to move the fundamental frequency and the higher harmonics of all of the clock signals out of the wanted receive channel.

When Mode 1 is selected, all of the spur avoidance circuit elements in the receiver signal paths can be bypassed and the spur frequency is controlled by adjusting clock division factor N2 only. However, Mode 1 alters the sampling rate of digitized data entering the DSP 56 and therefore may alter the performance of the receiver. The receiver performance may be more negatively affected the more the ADC sampling rate is moved away from the native ADC sampling rate. Therefore, Mode 1 is usually applied when only a small change in clock frequency is needed to offset all clock harmonics out of the wanted signal channel. For instance, Mode 1 is useful when the wanted channel has a high frequency or a narrow frequency band.

Mode 2—Change Clock Frequency with Sample Rate Conversion

The second spur avoidance mode (Mode 2) operates by changing or shifting the frequency of the clocks of the receiver, including the ADC clock, the DSP clock and the DAC clock, to move the clocks' fundamental frequency and/or harmonics outside of the wanted signal channel while maintaining the sampling rate at the DSP the same as the native DSP sampling rate. Mode 2 is particularly useful when the wanted signal is at a low frequency or the wanted signal channel has a large spectrum so that it is more difficult to shift the clock harmonics out of the wanted spectrum. In that case, the clock frequency of the receiver needs to be changed by a large amount to move the spur-induced noise out of the wanted signal channel and Mode 2 applies sample rate conversion on data entering the DSP to compensate for the large clock frequency changes.

In applications where the wanted receive channel is at a low frequency or has a large spectrum, it may be necessary to move the clock frequency of the clock signals a lot in order to shift the spurs out of the wanted channel spectrum. For example, assume a clock frequency of 32 MHz for the ADC clock and the DSP clock, if the receive channel is 64 MHz and the channel spectrum is 8 MHz, the second order harmonic of the ADC/DSP clock will occur inside the desired received channel of 64 MHz. In that case, the second spur avoidance mode may be applied to shift the frequency of the ADC/DSP clock (and/or other clocks in the receiver) by a large amount so that the second order harmonic will be outside of the wanted receive channel. For example, the ADC/DSP clock frequency can be reduced to be less than 30 MHz so that the second harmonic is less than 60 MHz and outside of the frequency band of the wanted channel. However, shifting the clock frequency from 32 MHz to 30 MHz is a large frequency change and compensation is applied to maintain the performance of the receiver.

In embodiments of the present invention, Mode 2 is implemented by increasing or decreasing the clock division factor N2 of clock divider 106 in the clock PLL 70, by selecting the bypass signal paths 81 and 84 to bypass the input buffer 74 and the output buffer 80, and by opening switch S0 to not apply the jitter sequence to the DSP clock. The switch S1 may select clock signal A or clock signal B depending on the application. Mode 2 is implemented in the same manner as Mode 1 except that a larger variation in the clock division factor N2 is applied and the input and output sample rate converters are left in the receiver signal path to reinterpolate the data so as to realize a constant sampling rate at the DSP.

In Mode 2, when the clock rate of the ADC clock signal is varied to shift the clock spur, the input sample rate converter 76 is used to reinterpolate the digitized data before the digitized data is processed by the DSP 56 so as to keep the sampling rate as seen by the DSP constant, that is, same as the native DSP sampling rate. The data interpolation relies on the assumption that not every clock cycle carries a valid data. More specifically, the ADC 54 digitizes the incoming data at the ADC clock rate as altered by the clock division factor N2. The input sample rate converter SRI 76 readjusts the sampling rate of the digitized data to the native DSP sampling rate or an internal DSP sampling rate related to the native DSP sampling rate before the digitized data is processed by the DSP 56. While the DSP clock signal has been offset, the data carried/processed inside the DSP unit are still uniformly sampled to the native DSP sampling rate (or an internal DSP sampling rate related to the native DSP sampling rate). Then, at the output of the DSP, the processed data generated by the DSP 56 is resampled back to the clock rate of the DAC clock signal by the SRO 78 to match the DAC clock rate as altered by the clock division factor N2. In Mode 2, exact resampling is possible because all the clock rate alterations are digitally controlled at the CGU 72.

Mode 2 preserves a high signal quality because while the clock frequencies of the ADC and DAC are altered, the DSP processes data at the native DSP sampling rate. Therefore, the performance of the receiver is preserved by maintaining the same sampling rate at the DSP while altering the clock rate of the ADC, DSP and DAC clocks to reduce spurs.

In the above embodiments, Mode 2 is operated with the output sample rate converter 78 left in the receiver signal path. The output sample rate converter 78 is needed based on the assumption that the DSP sampling frequency (or the DSP output sampling frequency) is different from the DAC clock frequency. Therefore, sample rate conversion is performed to change the sampling rate of the output data from the DSP to the sampling rate of the DAC. In other embodiments, when the DAC clock signal or the auxiliary clock signal after the DSP has the same frequency as the DSP sampling frequency, the output sample rate converter 78 may be omitted in the receiver signal path as no sample rate conversion is required.

Mode 3—Change Clock Frequency with DSP faster than ADC

The third spur avoidance mode (Mode 3) operates by increasing the frequency of the DSP clock out of the wanted channel spectrum while keeping the ADC and DAC clock frequencies the same as their native values. Typically, the DSP generates a lot of clock spurs at the DSP clock frequency and its harmonics because a lot of DSP processing activities occur at the DSP clock rate. By shifting the clock frequency of the DSP clock so that the fundamental frequency or the harmonics are out of the wanted channel spectrum, significant spur reduction can be realized.

In embodiments of the present invention, Mode 3 is implemented by decreasing the clock division factor N4 of clock divider 112 in the CGU 72, by selecting the bypass signal paths 82 and 83 to bypass the SRI 76 and the SRO 78, and by opening switch S0 to not apply the jitter sequence to the DSP clock. The switch S1 is set to select clock signal A from clock divider 110. Thus, the ADC clock signal is not derived from the DSP clock signal. The input buffer 74 and the output buffer 80 remain in the receiver signal path.

When the clock division factor N4 is decreased, the resulting DSP clock thus runs at a higher fixed frequency. The clock frequency of the DSP clock is increased so that it is outside of the wanted channel spectrum. As thus configured, the DSP thus runs faster than the ADC and the DAC. As a result, the DSP processes data faster than the ADC can supply the digitized samples of the incoming data. The DSP also processes data faster than the DAC can samples the processed data from the DSP. To that end, the input buffer 74 and the output buffer 80 are used to store data going into and out of the DSP in order to accommodate the higher clock rate of the DSP that still carries data at the native DSP sample rate. More specifically, the input buffer 74 includes the empty detect circuit to inject spare cycles into the data_valid signal when the buffer is empty. Thus, in Mode 3, even though the DSP clock rate has increased, the sampling rate does not change because of the introduction of the spare idle clock cycle, and there is no performance degradation due to sampling rate mismatch.

Mode 3 has the advantage of being able to skew the DSP clock frequency without performance degradation and without the use of the SRI/SRO circuits. The SRI and SRO circuits can be powered off to conserve energy. Mode 3 can be applied only to increase the DSP clock frequency so that DSP processing is faster than the ADC and the DAC and no data lost would result.

Mode 4—Spread DSP Clock Frequency

The fourth spur avoidance mode (Mode 4) operates by spreading the clock spectrum to reduce the power of the clock spectrum through the use of the predictable periodic pseudo-random number sequence, or jitter sequence, $\Delta N(n)$. In some applications, clock spectrum spreading is sometimes preferred over shifting of the clock spur location because there may be stringent requirements for spur radiation on all frequency bands. Also, there are applications where a receiver is intended to receive multiple channels in parallel with no feasible settings to move the clock spurs out of the receiving windows. Clock spreading is useful in situations where shifting of the clock spurs is not sufficient or not practical.

In Mode 4, only the DSP clock is jittered while both the ADC clock and the DAC clock are left unaltered. Spreading the DSP clock is sufficient to reduce interference from clock spurs as the DSP is computationally intensive and a lot of processing activities occur on the DSP clock.

In embodiments of the present invention, Mode 4 is implemented by closing switch S0 to apply the jitter sequence $\Delta N(n)$ to the DSP clock sisal. Switch S1 selects clock signal A so that the ADC clock signal is not jittered. The bypass signal paths 82 and 83 are selected to bypass the SRI 76 and the SRO 78. However, the input buffer 74 and the output buffer 78 remains in the receiver signal path. Because the ADC clock is not jittered, the ADC sampling rate of the incoming data has not changed and therefore sample rate conversion is not needed. However, because of the jittering of the DSP clock, the input buffer and the output buffer are used to store data before and after DSP processing to account for the different clock rates. As thus configured, the input buffer and the output buffer operate with one of their read/write ports having a variable clock rate while the other of the read/write ports having a constant frequency.

In Mode 4, the average frequency of the DSP clock matches the frequency of the ADC and DAC clocks provided that the $\Delta N(n)$ is periodic with a zero mean value. However, the DSP clock is spread over a range defined by the jitter sequence $\Delta N(n)$. The input buffer and output buffer are sized accordingly to store enough data to absorb the local clock rate variation of the read clock and the write clock. As long as sufficient buffer memory is provided, Mode 4 can be implemented with aggressive clock spreading without degrading the receiver performance at all. In some embodiments, the input buffer and the output buffer are provided with sufficient memory to handle numbers of samples that correspond to the maximum/minimum accumulated timing difference between CLK_ADC/CLK_DAC and the CLK_DSP. The maximum/minimum accumulated timing difference is a function of the value of K and L of the PRNG 118 as described above.

Importantly, because the DSP clock is jittered using a predictable periodic pseudo-random number sequence, the DSP clock spreading is predictable and the known jitter sequence can be used to reproduce and keep track of the input samples while the DSP clock varies about an average frequency and the ADC and DAC clocks remain constant.

Mode 5—Spread ADC and DSP Clock Frequency

The fifth spur avoidance mode (Mode 5) operates by spreading both the ADC clock and the DSP clock while keeping the ADC clock edge and the DSP clock edge separated by a fixed amount. That is, both the ADC clock and the DSP clock are jittered using the same jitter sequence. Furthermore, the clock edges of the two clocks are separated but synchronous with each other so that the ADC clock edge and the DSP clock edge do not move relative to each other.

Mode 5 is an extension of Mode 4 but with the ADC clock synchronous with the DSP clock. In Mode 4, only the DSP clock is jittered while the ADC clock is kept unaltered. Thus, the ADC clock is asynchronous to the DSP clock. However, as thus operated, the clocks' relative clock edges may collide, leading to instants of analog-to-digital conversion occurring too close to the DSP clock pulse which is undesirable as the DSP clock introduces a lot of spur noise. When the ADC and DSP clock edges become too close, performance degradation results when the DSP clock noise gets injected into the analog-to-digital conversion operation. In Mode 5, the ADC clock and the DSP clock are spread identically and a fixed relative phase difference is kept between the two clocks to avoid the clock edges from colliding.

In embodiments of the present invention, Mode 5 is implemented by closing switch S0 to apply the jitter sequence ΔN(n) to the DSP clock signal. Switch S1 selects clock signal B so that the ADC clock signal is derived from the DSP clock and has the same jitter pattern. The bypass signal path 81 is selected to bypass the input buffer 74. The bypass signal path 83 is also selected to bypass the output sample rate converter 78. The input sample rate converter 76 and the output buffer 80 remain in the receiver signal path.

When the ADC clock signal is spread by the jitter sequence, the sampling rate at the output of the ADC 54 becomes non-uniform and the samples must be reconstructed before the samples enter the DSP to avoid SNR degradation. Accordingly, the input sample rate converter SRI 76 is used in Mode 5 to generate a uniformly sampled data stream based on the jittered digitized data from the ADC. That is, the SRI 76 uniformly resample the digitized data from the ADC. In the SRI, the jitter sequence is regenerated locally in synchronous with the received data to devise the fractional and integer positions needed for signal reconstruction. The SRI 76 relies on the roll-over sync signal from the PRNG 118 of the CGU 72 to know when the sequence starts and to synchronize with the ADC clock's jitter sequence. Delay adjustment may be added to match the ADC to SRI path latency. In Mode 5, while the DSP clock signal is jittered, the data carried/processed inside the DSP unit are uniformly sampled to the native DSP sampling rate. While the SRO 78 may be bypassed, the output buffer 80 can be used to guarantee a smooth delivery of data to the DAC unit.

In the above embodiments, Mode 5 is operated with the output sample rate converter 78 bypassed. The output sample rate converter 78 is not needed based on the assumption that the DSP sampling frequency (or the DSP output sampling frequency) is the same as the DAC clock frequency. Therefore, no sample rate conversion needs to be performed. In other embodiments, when the DAC clock signal or the auxiliary clock signal after the DSP has a different frequency than the DSP sampling frequency, the output sample rate converter 78 may be used to perform sample rate conversion of the processed data from the DSP.

Combination of Modes

The five spur avoidance modes described above may be used alone or may be combined in certain applications to optimize the performance of the receiver. In one embodiment, Mode 3 and Mode 4 are combined where the clock spreading is applied to the DSP clock frequency which is higher in average than the ADC clock.

Clock Masking Scheme

When combining analog and digital circuitries in a mixed-signal system, some additional precautions must be taken to handle instantaneous digital noise injection that occurs right after the clock edges. In a mixed-signal system, most of the digital activity occurs in a small timing window located right after the sequential elements are updated and the logic signals propagated through the combinatorial cone. Also a high current is drawn from the power supply to switch the clock tree buffers as well as flip-flops clock ports. Special precautions must be taken to ensure that this local high level digital activity does not coincide with a critical, sensitive analog event. For instance, for an ADC, it is desirable to avoid high digital activity at the ADC sampling time (usually given by the rising clock edge) of the ADC where the analog data are latched to be converted. Similarly, an analog clock PLL, such as the PLL shown in FIG. 3, will evaluate the phase error at the clock edge of CLK_Ha and CLK_Refa clock signals and is therefore more sensitive to noise during that timing window, which is critical for obtaining good PLL clock jitter performance. When all the clocks of the analog and digital circuits can be kept synchronous to each other, at the same or harmonic frequencies, one can simply statically delay some of the clocks to make sure that the analog and digital clocks phases are shifted enough to avoid interference. However, the synchronous condition cannot always be guaranteed in any mixed-signal system. For instance, when the third and fourth spur avoidance modes (Mode 3 and Mode 4) described above are applied, the ADC clock and DSP clock are asynchronous and their clock edges may overlap. More generally, a mixed signal architecture can be susceptible to contain multiple analog and digital clocks that are asynchronous to each other and that can create injection noise at ADC or analog PLL interfaces.

According to another aspect of the present invention, a clock masking scheme is applied in a mixed-signal system to prevent overlapping of digital clock edges and analog clock edges to enhance the isolation of the digital and analog activities. More specifically, when the clock generation in the mixed-signal system is entirely digitally controlled, the timing locations of all of the clock edges are known. The clock masking scheme is implemented by extracting signals from the digital clock generation circuit to create gating pulses that are recombined and used to delay the digital or analog clock edges. As a result, analog activities can be carried out without noise injection from digital activities that may occur too close to the analog activities. For instance, a clock mask may be applied to the digital clocks around ADC clock edges to prevent digital activities from taking place just before or at ADC sampling instants. Alternately, a clock mask may be applied to the analog clocks to prevent analog activities, such as ADC sampling, from taking place during digital activities, such as digital signal processing. In this manner, the clock masking scheme of the present invention realizes a layer of digital-to-analog noise isolation for sensitive analog blocks that requires low noise at given sampling instant.

A salient feature of the clock masking scheme of the present invention is that the clock masking operation is scalable and can be applied to one or more analog clock signals and one or more digital clock signals. In the following description, the clock masking scheme is described as being applied to two analog clock signals and one digital clock signal. This description herein is illustrative and is not intended to be limiting. The clock masking scheme of the present invention can be configured to operate on any number of analog and digital clock signals.

Figure 10:
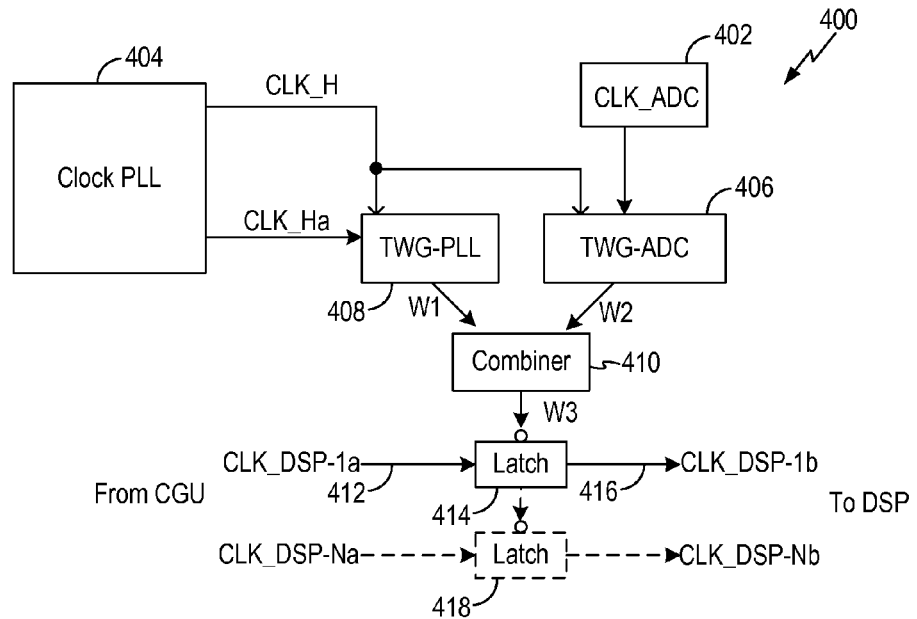
FIG. 10 is a schematic diagram of a clock masking circuit for gating a digital clock signal from two analog clock signals according to one embodiment of the present invention.
Figure 11:
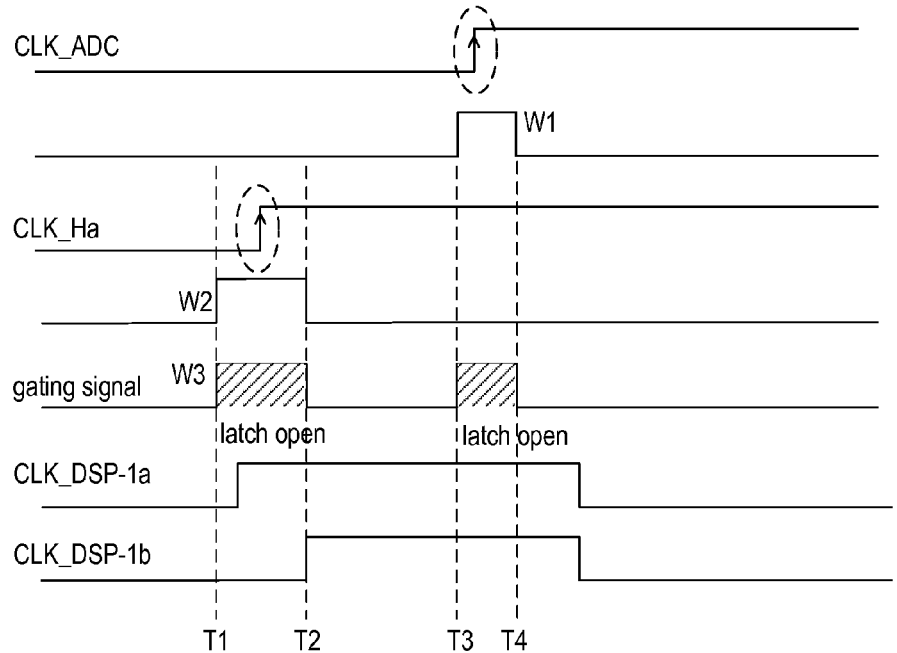
FIG. 11 includes waveforms illustrating the operation of the clock masking circuit of FIG. 10 according to one embodiment of the present invention.

FIG. 10 is a schematic diagram of a clock masking circuit for gating a digital clock signal from two analog clock signals according to one embodiment of the present invention. FIG. 11 includes waveforms illustrating the operation of the clock masking circuit of FIG. 10 according to one embodiment of the present invention. In the embodiment shown in FIGS. 10 and 11, a clock masking circuit 400 is applied to detect clock edges of two analog clock signals 402, 404 and to gate or delay the clock edges of a digital clock signal 412 to provide isolation of analog and digital activities. The clock masking circuit 400 operates on analog and digital clock signals that are digitally generated and digitally controlled. To further illustrate the application and advantages of the clock masking scheme of the present invention, the clock masking scheme is described herein with reference to the clock generation circuitry (clock PLL 70 and CGU 72) of the RF receiver 50 described above. In one embodiment, the clock masking scheme described herein can be applied to the RF receiver 50 to enhance the isolation of the ADC sampling operations from the digital noise of the digital signal processing operation. However, references to the RF receiver 50 described above are illustrative only. The clock masking scheme and clock masking circuit of the present invention can be applied to other mixed-signal systems to realize isolation of analog and digital activities.

In the present embodiment, the first analog clock signal is a clock signal used to generate a phase error signal in a PLL. For instance, the first analog clock signal can be the divided clock signal CLK_Ha in the clock PLL 70 of receiver 50 (FIG. 3). Clock signal CLK_Ha is a divided down clock signal of the high frequency clock signal CLK_H and is coupled to the phase error charge pump 104 to generate the phase error signal for controlling the VCO 102. Clock signal CLK_Ha needs to be protected from digital noise injection to prevent the phase error comparison from being corrupted.

Furthermore, in the present embodiment, the second analog clock signal is the ADC clock signal for driving an analog-to-digital converter to perform the data sampling and conversion. For instance, the second analog clock signal can be the ADC clock signal generated by the CGU 72 in receiver 50 (FIG. 4). The ADC clock signal drives the ADC circuit to sample the incoming data. The ADC clock signal needs to be protected from the digital noise injection to prevent the sampling instants from being corrupted by the digital noise injection.

In the present embodiment, the digital clock signal is the DSP clock signal for driving a digital signal processor. For instance, the digital clock signal can be the DSP clock signal (CLK_DSP) generated by the CGU 72 in receiver 50 and used to drive the circuitry of DSP 56 in the receiver. Because the processing operations of the DSP can be intensive, large amount of digital noise can be generated on the DSP clock edges and injection of the digital noise into sensitive analog operation is undesirable.

Referring to FIG. 10, the clock masking circuit 400 includes a first timing window generator (TWG-ADC) 406 coupled to receive the first analog clock signal being an ADC clock signal CLK_ADC and a second timing window generator (TWG-PLL) 408 coupled to receive the second analog clock signal being a phase error comparison clock signal CLK_Ha. The first and second timing window generators 406, 408 are clocked by a reference clock signal. The gating signal to be generated by the clock masking circuit 400 will have clock edges aligned to the reference clock signal. In the present embodiment, the reference clock signal is the high frequency clock signal CLK_H of the clock PLL 70 in RF receiver 50. In other embodiments, any other reference clock signal can be used as long as the reference clock signal has a frequency higher than the analog and digital signals being processed by the clock masking circuit.

Because the clock circuits that generate the first and second analog clock signals are digitally controlled, the timing window generators 406, 408 can determine the locations of the clock edges of the respective analog clock signals. The timing window generators 406, 408 generate timing window pulses that are centered around the clock edges of the analog clock signals to be protected from digital noise injection, as shown in FIG. 11. In the present embodiment, it is assumed that the rising edges of the analog clock signals are the sensitive clock edges to be protected. For instance, the rising clock edge of the ADC clock signal is the ADC data sampling instant. The first timing window generator (TWG-ADC) 406 generates a timing window pulse W1 centered around the rising clock edge of the first analog clock signal (CLK_ADC). Similarly, the rising clock edge of the phase error comparison clock signal is the instant when the phase error comparison is performed. The second timing window generator (TWG-PLL) 408 generates a timing window pulse W2 centered around the rising clock edge of the second analog clock signal (CLK_Ha). The pulse width of the timing window pulses can be selected based on user preference. However, the clock edges of the timing window pulses are aligned with the reference clock signal (CLK_H in the present embodiment).

The clock masking circuit 400 includes a timing window combiner 410 configured to combine the two timing window pulses W1 and W2 to generate a gating signal W3, as shown in FIG. 11. In one embodiment, the timing window combiner 410 can be implemented to perform a logical OR combination. In other embodiments, the timing window combiner 410 can be implemented to perform other pulse merging operations, such as maximal pulse width recombination limitation to prevent too much clock edge delay or absorbing two non-overlapping but very close pulses into a single pulse to avoid a short pulse clock generation. The gating signal W3 includes pulses indicating when digital activities should be prevented. More specifically, the gating signal W3 is used to gate or delay or stop the digital clock signal 412, thereby preventing the digital clock signal 412 from switching close to the analog clock edges.

In the present embodiment, the clock masking circuit 400 uses a latch circuit 414 to gate the digital clock signal. The latch circuit 414 receives the gating signal W3 as the control signal. The latch circuit 414 also receives the digital clock signal 412 as an input digital signal and generates a gated digital clock signal 416 as an output digital signal. When the gating signal W3 is inactive, such as when signal W3 is in a logical low state, the latch circuit 400 allows the input signal (CLK_DSP) to pass through. However, when the gating signal W3 is active, such as in a logical high state, the latch circuit 400 is engaged to prevent the output digital clock signal from switching, regardless of the state of the input clock signal.

Referring to FIG. 11, the gating signal W3 thus generated has a gating pulse from time T1 to time T2 to guard the phase error comparison clock CLK_Ha and another gating pulse from time T3 to time T4 to guard the rising edge of the ADC clock CLK_ADC. The digital clock signal CLK_DSP has a rising edge transition that occurs between time T1 and T2. The rising edge transition is delayed to time T2 by the action of the latch circuit 414 so that the gated digital signal (CLK_DSP-a) has a rising edge delayed to time T2. Although there is no rising edge transition during time T3 and T4, the latch circuit latches the state of the digital clock signal through time T4 and then the digital clock signal is allowed to pass through to the gated digital clock signal after time T4.

In embodiments of the present invention, the clock masking circuit 400 can be configured to handle two or more analog clock signals by generating respective timing window pulses for each analog clock signals and combining the timing window pulses at the combiner 410 to generate the gating signal W3. When the clock masking circuit 400 is configured to mask only a single analog clock signal, the combiner may be omitted and the timing window pulse for the single analog clock signal may be used as the gating signal.

Furthermore, in embodiments of the present invention, the clock masking circuit 400 can be configured to latch two or more digital clock signals based on the gating signal W3, such as by incorporating additional latch circuits 418, as shown in FIG. 10.

Figure 12:
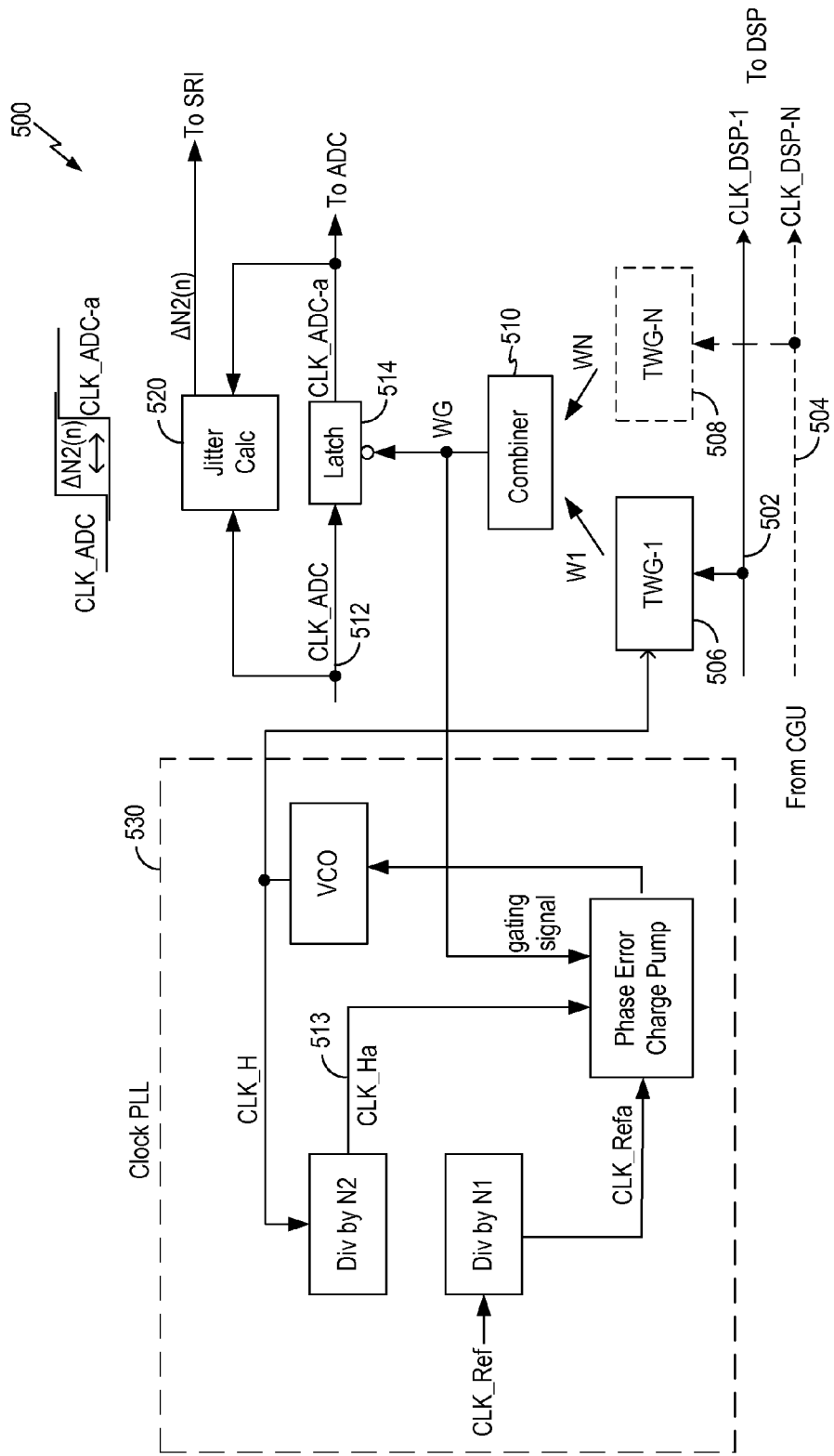
FIG. 12 is a schematic diagram of a clock masking circuit for gating two analog clock signals from a single or multiple digital clock signals according to one embodiment of the present invention.

The clock masking circuit 400 of FIG. 10 operates to gate one or more digital clock signals at the clock edges of one or more analog clock signals. The clock masking scheme of the present invention can also be applied to gate one or more analog clock signals at the clock edges of one or more digital clock signals. FIG. 12 is a schematic diagram of a clock masking circuit for gating two analog clock signals from a single or multiple digital clock signals according to one embodiment of the present invention. In the embodiment shown in FIG. 12, a clock masking circuit 500 is applied to detect clock edges of one or more digital clock signals 502, 504 and to gate or delay the clock edges of one or more analog clock signals 512, 513 to provide isolation of analog and digital activities. The clock masking circuit 500 is a duality of the clock masking circuit 400 and is similarly constructed. The clock masking circuit 500 operates on analog and digital clock signals that are digitally generated and digitally controlled. In the present embodiment, the clock masking circuit is described with reference to the clock generation circuitry of the RF receiver 50 described above. However, references to the RF receiver 50 described above are illustrative only. The clock masking circuit of the present invention can be applied to other mixed-signal systems to realize isolation of analog and digital activities.

In the present embodiment, the clock masking circuit 500 receives one or more digital clock signals 502, 504 which are depicted as DSP clock signals. The DSP clock signals can be a DSP clock signal generated by the CGU 72 in RF receiver 50. The clock masking circuit 500 is applied to gate a first analog signal being the ADC clock signal CLK_ADC and a second analog signal being the phase error comparison signal CLK_Ha.

The clock masking circuit 500 includes one or more timing window generators 506, 508 coupled to receive a respective one of the digital clock signals 502, 504 and generating timing window pulses W1, WN that are centered around the rising and/or falling clock edges of the digital clock signals. The timing window pulses are combined at a timing window combiner 510 configured to combine the timing window pulses W1, WN to generate a gating signal WG. The gating signal WG is used to control the gating of the analog clock signals.

In the present embodiment, the gating signal WG is coupled to a PLL 530 to gate the phase error charge pump so that phase error comparison in the PLL 530 do not occurs at the clock edges of the digital clock signals. In this manner, digital noise injection into the PLL feedback loop is prevented. The PLL 530 can be the clock PLL 70 of RF receiver 50 in FIG. 3.

In the present embodiment, the gating signal WG is also coupled to control a latch circuit 514 receiving an ADC clock signal 512 as the analog clock signal. The latch circuit 514 prevents the ADC clock signal 512 from switching during the gating pulses of the gating signal. However, while the output analog clock signal CLK_ADCa is masked to prevent overlapping with digital activities, the masking of the ADC clock results in a non-uniformly sampled digitized signal. The non-uniformly sampled digitized signal may need to be reconstructed to a uniform sampling time before further processing is performed.

According to one aspect of the present invention, a jitter calculation circuit 520 is used to compare the ADC clock signal before the latch circuit and the ADC clock signal after the latch circuit to determine the amount of delay $\Delta N2(n)$ between the two signals. The delay signal $\Delta N2(n)$ can be used by a sample rate converter, similar to the SRI block configured as a uniform resampler circuit, to reconstruct the digitized samples to a uniformly sampled sequence.

The above description illustrates exemplary embodiments of the clock masking circuit and clock masking operation under the clock masking scheme of the present invention. The above described embodiments are illustrative only and not intended to be limiting. The clock masking circuit can be implemented in other ways to realize the clock masking operation for isolating digital and analog activities.

The above detailed descriptions are provided to illustrate specific embodiments of the present invention and are not intended to be limiting. Numerous modifications and variations within the scope of the present invention are possible. The present invention is defined by the appended claims.

We claim:

1. A spur avoidance circuit in a mixed-signal radio frequency (RF) receiver where the RF receiver is coupled to receive an incoming RF signal and to generate at least a processed digital output signal, the RF receiver including at least an RF-Analog front end circuit, an analog-to-digital converter (ADC) and a digital signal processor (DSP), the spur avoidance circuit comprising:

a clock synthesizer circuit configured to generate a first clock signal having a first clock frequency;

a clock generator circuit configured to receive the first clock signal and to generate a second clock signal to control the ADC, a third clock signal to control the DSP and a fourth clock signal, the second, third and fourth clock signals having respective second, third and fourth clock frequencies related to the first clock frequency, wherein, in selected operation modes, the clock generator circuit is further configured to apply a jitter sequence to jitter the second and/or third clock frequency around a mean frequency value based on a predictable, periodic pseudo-random number sequence;

an input buffer configured to receive input data from the ADC and to store the input data, the input buffer having a write port being driven by the second clock signal and a read port being driven by the third clock signal;

an input sample rate converter configured to receive input data from the input buffer or the ADC at an input sampling rate and to generate output data at an output sampling rate being a uniform sampling rate, the input sample rate converter configured to provide the output data to the DSP;

an output sample rate converter configured to receive input data from the DSP at an input sampling rate being a uniform sample rate and to generate output data at an output sampling rate matching the fourth clock frequency;

an output buffer configured to receive input data from the DSP or the output sample rate converter and to store the input data, the output buffer having a write port being driven by the third clock signal and a read port being driven by the fourth clock signal; and a plurality of bypass signal paths coupled to each of circuit elements including the input buffer, the input sample rate converter, the output sample rate converter and the output buffer, the plurality of bypass signal paths being selectively activated to bypass one or more of the circuit elements coupled thereto, wherein the DSP receives input data either from the ADC, or from the input buffer, or from the input sample rate converter; and the DSP providing output data to either the output sample rate converter, to the output buffer or as the processed digital output signal, wherein the spur avoidance circuit is configured to operate in one or more operation modes selected from a plurality of operation modes using the plurality of bypass signal paths to select or bypass one or more of the circuit elements, the spur avoidance circuit is operated in a first set of operation modes to shift the second, third, and fourth clock frequencies out of a wanted signal channel of the RF receiver and is configured in a second set of operation modes to spread the clock frequency of at least the third clock signal based on the predictable, periodic pseudo-random number sequence.

2. The spur avoidance circuit of claim 1, wherein the spur avoidance circuit is configured in a first operation mode with the input buffer, the input sample rate converter, the output sample rate converter and the output buffer bypassed by the plurality of bypass signal paths and the clock synthesizer circuit generates the first clock frequency having a value for shifting the second, third and fourth clock frequencies out of the wanted signal channel.

3. The spur avoidance circuit of claim 1, wherein the spur avoidance circuit is configured in a second operation mode with at least the input buffer and the output buffer bypassed by the plurality of bypass signal paths and the clock synthesizer circuit generates the first clock frequency having a value for shifting the second, third and fourth clock frequencies out of the wanted signal channel, the input sample rate converter being applied to modify the sampling rate of digitized data from the ADC to a sampling rate of the DSP.

4. The spur avoidance circuit of claim 3, wherein the output sample rate converter is applied to modify the sampling rate of processed data from the DSP to the fourth clock frequency when a DSP output sampling rate is different from the fourth clock frequency.

5. The spur avoidance circuit of claim 3, wherein the output sample rate converter is bypassed by the plurality of bypass signal paths when a DSP output sampling rate is the same as the fourth clock frequency.

6. The spur avoidance circuit of claim 1, wherein the spur avoidance circuit is configured in a third operation mode with the input sample rate converter and the output sample rate converter bypassed by the plurality of bypass signal paths and the clock generator circuit generates the third clock frequency having a value outside of the wanted signal channel but greater than the second clock frequency, the input buffer storing digitized data for the DSP and the output buffer storing processed data generated by the DSP.

7. The spur avoidance circuit of claim 1, wherein the spur avoidance circuit is configured in a fourth operation mode with the input sample rate converter and the output sample rate converter bypassed by the plurality of bypass signal paths and the clock generator circuit applies the jitter sequence to jitter the third clock frequency around the mean frequency value based on the predictable, periodic pseudo-random number sequence, the input buffer storing digitized data for the DSP and the output buffer storing processed data generated by the DSP.

8. The spur avoidance circuit of claim 1, wherein the spur avoidance circuit is configured in a fifth operation mode with at least the input buffer bypassed by the plurality of bypass signal paths and the clock generator circuit applies the jitter sequence to jitter the second and third clock frequencies around the mean frequency value based on the predictable, periodic pseudo-random number sequence, the second clock signal being offset in phase from the third clock signal by a predetermined amount, the input sample rate converter being applied to uniformly resample the non-uniformly sampled digitized data from the ADC to a uniform sampling rate of the DSP, and the output buffer storing processed data generated by the DSP.

9. The spur avoidance circuit of claim 8, wherein the output sample rate converter is applied to modify the sampling rate of processed data from the DSP to the fourth clock frequency when a DSP output sampling rate is different from the fourth clock frequency.

10. The spur avoidance circuit of claim 8, wherein the output sample rate converter is bypassed by the plurality of bypass signal paths when a DSP output sampling rate is the same as the fourth clock frequency.

11. The spur avoidance circuit of claim 1, wherein the RF receiver further includes a digital-to-analog converter (DAC) for converting the processed digital output signal to analog output signals, the fourth clock signal being coupled to drive the DAC.

12. The spur avoidance circuit of claim 1, wherein the clock synthesizer circuit comprises a phase lock-loop.

13. The spur avoidance circuit of claim 1, wherein the input sample rate converter receives input data from the input buffer or the ADC at a uniform input sampling rate or non-uniform sampling rate.

14. A method for reducing digital noise injection in a mixed-signal radio frequency (RF) receiver, the RF receiver receiving an incoming RF signal, digitizing the incoming RF signal, processing digitized data, and generating processed digital output data, the method comprising:

configuring the RF receiver to operate in a first operation mode to shift the clock frequencies of the digitizing step and the processing step out of the wanted signal channel;

configuring the RF receiver to operate in a second operation mode to shift the clock frequencies of the digitizing step and the processing step out of the wanted signal channel and to modify the sampling rate of digitized data from the digitizing step to a sampling rate of the processing step;

configuring the RF receiver to operate in a third operation mode to shift the clock frequencies of the processing step out of the wanted signal channel and greater than the second clock frequency, and further to store the digitized data in an input buffer before the processing step and to store the processed digital output data in an output buffer after the processing step;

configuring the RF receiver to operate in a fourth operation mode to apply a jitter sequence to jitter the clock frequency of the processing step around a mean frequency value based on a predictable, periodic pseudo-random number sequence, and further to store the digitized data in an input buffer before the processing step and to store the processed digital output data in an output buffer after the processing step; and configuring the RF receiver to operate in a fifth operation mode to apply the jitter sequence to jitter the clock frequency of the digitizing step and the processing step around the mean frequency value based on the predictable, periodic pseudo-random number sequence, the clock frequency of the digitizing step being offset in phase from the clock frequency of the processing step, and further to perform uniform resampling of the non-uniformly sampled digitized data from the digitizing step to a uniform sampling rate before the processing step and to store the processed digital output data in an output buffer after the processing step.

15. The method of claim 14, further comprising configuring the RF receiver to operate in two or more of the first, second, third, fourth and fifth operation modes.

16. The method of claim 14, wherein configuring the RF receiver to operate in a second operation mode further comprises modifying the sampling rate of processed data from the processing step to a auxiliary clock frequency when the clock frequency of the processing step is different from the auxiliary clock frequency.

17. The method of claim 14, wherein configuring the RF receiver to operate in a fifth operation mode further comprises modifying the sampling rate of processed data from the processing step to a auxiliary clock frequency when the clock frequency of the processing step is different from the auxiliary clock frequency.

18. The method of claim 14, further comprises:
converting the processed digital output data from the processing step to an analog output signal.

19. The method of claim 14, wherein the RF receiver operates based on one or more analog clock signals and one or more digital clock signals, the method further comprising:
generating one or more timing window pulses that are centered around the clock edges of one of the digital clock signals or the analog clock signals;
combining the timing window pulses to generate a gating signal, the gating signal having an active logical level at each of the timing window pulses; and
applying the gating signal to gate or delay clock edges of the other one of the digital clock signals or the analog clock signals.

* * * * *